US006967639B2

(12) United States Patent
Kanzaki et al.

(10) Patent No.: US 6,967,639 B2
(45) Date of Patent: Nov. 22, 2005

(54) IMAGE DISPLAY DEVICE, SCAN LINE DRIVE CIRCUIT AND DRIVER CIRCUIT FOR DISPLAY DEVICE

(75) Inventors: Eisuke Kanzaki, Fujisawa (JP); Manabu Kodate, Yokohama (JP)

(73) Assignee: International Business Machines Corporation, Armonk, NY (US)

(*) Notice: Subject to any disclaimer, the term of this patent is extended or adjusted under 35 U.S.C. 154(b) by 464 days.

(21) Appl. No.: 10/252,067

(22) Filed: Sep. 19, 2002

(65) Prior Publication Data

US 2003/0058234 A1 Mar. 27, 2003

(30) Foreign Application Priority Data

Sep. 26, 2001 (JP) ............................ 2001-295016

(51) Int. Cl.[7] .......................... G09G 3/36; G11C 19/00
(52) U.S. Cl. ........................................ 345/100; 377/64
(58) Field of Search .......................... 345/100, 211, 98, 345/99; 377/64–81

(56) References Cited

U.S. PATENT DOCUMENTS 4,180,813 A * 12/1979 Yoneda ...................... 345/100
5,150,389 A * 9/1992 Kawasaki .................... 377/67
5,977,944 A * 11/1999 Kubota et al. .............. 345/100
6,064,714 A * 5/2000 Alidina et al. ................ 377/69
6,157,361 A * 12/2000 Kubota et al. .............. 345/100
6,476,789 B1 * 11/2002 Sakaguchi et al. .......... 345/100
6,483,889 B2 * 11/2002 Kim et al. ..................... 377/54
6,496,169 B1 * 12/2002 Mametsuka .................. 345/87
6,630,920 B1 * 10/2003 Maekawa et al. ........... 345/100
6,670,944 B1 * 12/2003 Ishii ........................... 345/100
2001/0043187 A1 * 11/2001 Ikeda ......................... 345/100

FOREIGN PATENT DOCUMENTS

JP 5165045 10/1993
JP 6148680 5/1994

* cited by examiner

*Primary Examiner*—Patrick N. Edouard
*Assistant Examiner*—M. Fatahiyar
(74) *Attorney, Agent, or Firm*—William H. Steinberg; Hoffman, Warnick & D'Alessandro LLC

(57) ABSTRACT

An image display device, a scan line drive circuit and a driver circuit for the display device capable of driving the display device having a multiplex pixel structure by simple control and utilizing a simplified gate driver. The image display device includes a plurality of pixel electrodes, a plurality of scan lines G for supplying scan signals to turn on and off these pixel electrodes, a pulse generator for generating a shift pulse, buffers B provided corresponding to the respective scan lines G, and a shift register unit in which first and second shift registers SR1 and SR2 are alternately cascade-connected. The shift pulse is propagated through the first and the second shift registers SR1 and SR2 by outputting the shift pulse from the pulse generator to the shift register unit. In this way, the shift pulse is controlled to be propagated between a buffer B to an adjacent buffer B in one horizontal scanning cycle.

15 Claims, 17 Drawing Sheets

Gn+1: SELECTED, Gn+2: NOT SELECTED

Gn+2, Gn+3: SELECTED

Gn+2: SELECTED, Gn+3: NOT SELECTED

Gn+1: SELECTED, Gn+2: NOT SELECTED, Gn+3: SELECTED

Gn+1, Gn+2: SELECTED, Gn+3: SELECTED

Gn+1: SELECTED, Gn+2: NOT SELECTED, Gn+3: NOT SELECTED

IMAGE DISPLAY DEVICE, SCAN LINE DRIVE CIRCUIT AND DRIVER CIRCUIT FOR DISPLAY DEVICE

BACKGROUND OF THE INVENTION

The present invention relates to image display devices and the like, more particularly, to a technology to contribute high definition of a liquid crystal display device.

As it is generally known, in an active matrix drive display device, the number of driver integrated circuits (ICs) is increased along with an increase in the number of display pixels. Accordingly, such an increase in the number of driver ICs contribute to part of the reason for incurring a cost rise. Moreover, as pixel pitches are narrowed along with an advance in a high-definition screen, connection between a pixel and a driver IC is becoming difficult. To resolve these problems, a display device of a multiplex pixel structure is known in which one data line supplies electric potential to two or more adjacent pixels by time division, thus reducing the number of driver ICs and widening pitches between connective terminals (in Japanese Unexamined Patent Publications No. Hei 5(1993)-265045 or No. Hei 6(1994)-148680, for example).

However, according to the technologies described in Japanese Unexamined Patent Publications No. Hei 5(1993)-265045 and No. Hei 6(1994)-148680, two systems of scan lines are required to drive one pixel row. In this case, if different on/off signals are simply supplied to two systems of the scan lines in order to drive the pixel, waveform control of the on/off signals to be outputted to the respective scan lines will be complicated. In addition, two systems of output control lines are also required for controlling output of these on/off signals. Therefore, a structure of a gate driver will be also complicated. Particularly, these problems becomes more significant when one data line supplies the electric potential to three or more pixels.

OBJECTS AND SUMMARY OF THE INVENTION

A main object of the present invention is to provide an image display device and the like capable of driving a display device of a multiplex pixel structure just by control of simple on/off signals and capable of simplifying a structure of a gate driver thereof.

According to one aspect of the invention, there is provided an image display device comprising a plurality of signal lines for supplying display signals, a plurality of scan lines for supplying scanning signals, m (a number larger than 1) pieces of pixel electrodes with a given signal line, the pixel electrodes being serially selected in one horizontal scanning cycle, output circuits for outputting the scanning signals, the output circuits being connected with respective input terminals of the plurality of scan lines, and a propagation circuit for propagating an inputted signal sequence, the propagation circuit connecting the output circuits, wherein driving of m pieces of the pixel electrodes is controlled by combinations of the scanning signals supplied from a given plurality of the scan lines, and the propagation circuit propagates the scanning signal between the output circuits in one horizontal scanning cycle.

According to another aspect of the invention, there is provided a scan line drive circuit comprising output terminals connected with respective scan lines of an image display device, and a propagation circuit connecting the output terminals, wherein the propagation circuit includes a plurality of first shift registers corresponding to the respective scan lines and partial propagation circuits, each of which is cascade-connected between the first shift registers adjacent each other, the partial propagation circuit propagating a signal inputted to one of the first shift registers to another one of the first shift registers after one horizontal scanning cycle from a moment of input thereof.

According to yet another aspect of the invention, there is provided an image display device comprising a plurality of pixel electrodes, a plurality of scan lines for supplying scanning signals to selected ones of the pixel electrodes, a signal sequence generator for generating a signal sequence including a given number of signals, and a propagation circuit for propagating the signal sequence between the scan lines with a time interval shorter than a time width of the signal sequence.

According to still another aspect of the invention, there is provided a scan line drive circuit comprising a plurality of shift registers corresponding to respective scan lines of an image display device, partial propagation circuits disposed between the shift registers located adjacent one another, and a multiplex rate signal generator or outputting a multiplex rate signal to the partial propagation circuits, the multiplex rate signal indicating a multiplex rate of pixels of the image display device, wherein each of the partial propagation circuits propagates a given signal from one of the shift registers to another one of the shift registers with a time interval to be set up based on the multiplex rate.

According to a further aspect of the invention, there is provided a driver circuit for a display device comprising a plurality of output terminals, output circuits respectively connected to the output terminals, shift registers respectively connected to the output circuits, shift registers cascade-connected between the shift registers, and an output control line for transmitting a control signal to control output of the output circuits.

According to an even further aspect of the invention, there is provided a image display device comprising a plurality of pixels arranged in a matrix, a plurality of scan lines, a plurality of signal lines, m (a number larger than 1) pieces of pixels to be selected in a first horizontal scanning cycle, the pixels being connected with one of the signal lines, m pieces of pixels to be selected in a second horizontal scanning cycle subsequent to the first horizontal scanning cycle, the pixels being connected with the signal line, and a drive circuit connected with the plurality of scan lines, wherein the drive circuit includes a plurality of output terminals connected with the plurality of scan lines, output circuits connected with the respective output terminals, shift registers connected with the output circuits, a (m−1) number of pieces of shift registers cascade-connected between the shift registers, and an output control line for transmitting a control signal to control output of the output circuits.

According to another aspect of the invention, there is provided an image display device comprising a plurality of pixels arranged in a matrix, a plurality of scan lines, a plurality of signal lines, m (a number larger than 1) pieces of pixels to be selected in a first horizontal scanning cycle, the pixels being connected with a given signal line out of the plurality of signal lines, m pieces of pixels to be selected in a second horizontal scanning cycle subsequent to the first horizontal scanning cycle, the pixels being connected with the given signal line, and a drive circuit connected with the plurality of scan lines, wherein the m pieces of pixels are selected in the first horizontal scanning cycle by use of a first scan line set comprised of n lines of scan lines, the other m pieces of pixels are selected in the second horizontal scanning cycle by use of a second scan line set comprised of n lines of scan lines respectively shifted by one line from the scan lines of the first scan line set. The drive circuit is controlled by a clock signal, a signal sequence composed of 1 pieces of signals, in which 1 is larger than n, is inputted to the drive circuit, the drive circuit, to which the signal sequence is inputted, outputs scanning signals serially in a range from first timing to m-th timing with respect to groups from a first scan line group to an m-th scan line group which are mutually different combinations of the scan lines selected from the first scan line set in the first horizontal scanning cycle. The drive circuit initiates a process to output scanning signals serially in a range from first timing to m-th timing at m clocks after initiation of a process in the first horizontal scanning cycle with respect to groups from a first scan line group to an m-th scan line group which are mutually different combinations of the scan lines selected from the second scan line set in the second horizontal scanning cycle.

BRIEF DESCRIPTION OF THE DRAWINGS

For a more complete understanding of the present invention and the advantages thereof, reference is now made to the following description taken in conjunction with the accompanying drawings.

BEST MODE FOR CARRYING OUT THE INVENTION

Now, the present invention will be described in further detail based on embodiments as described with reference to the accompanying drawings.

Figure 1:
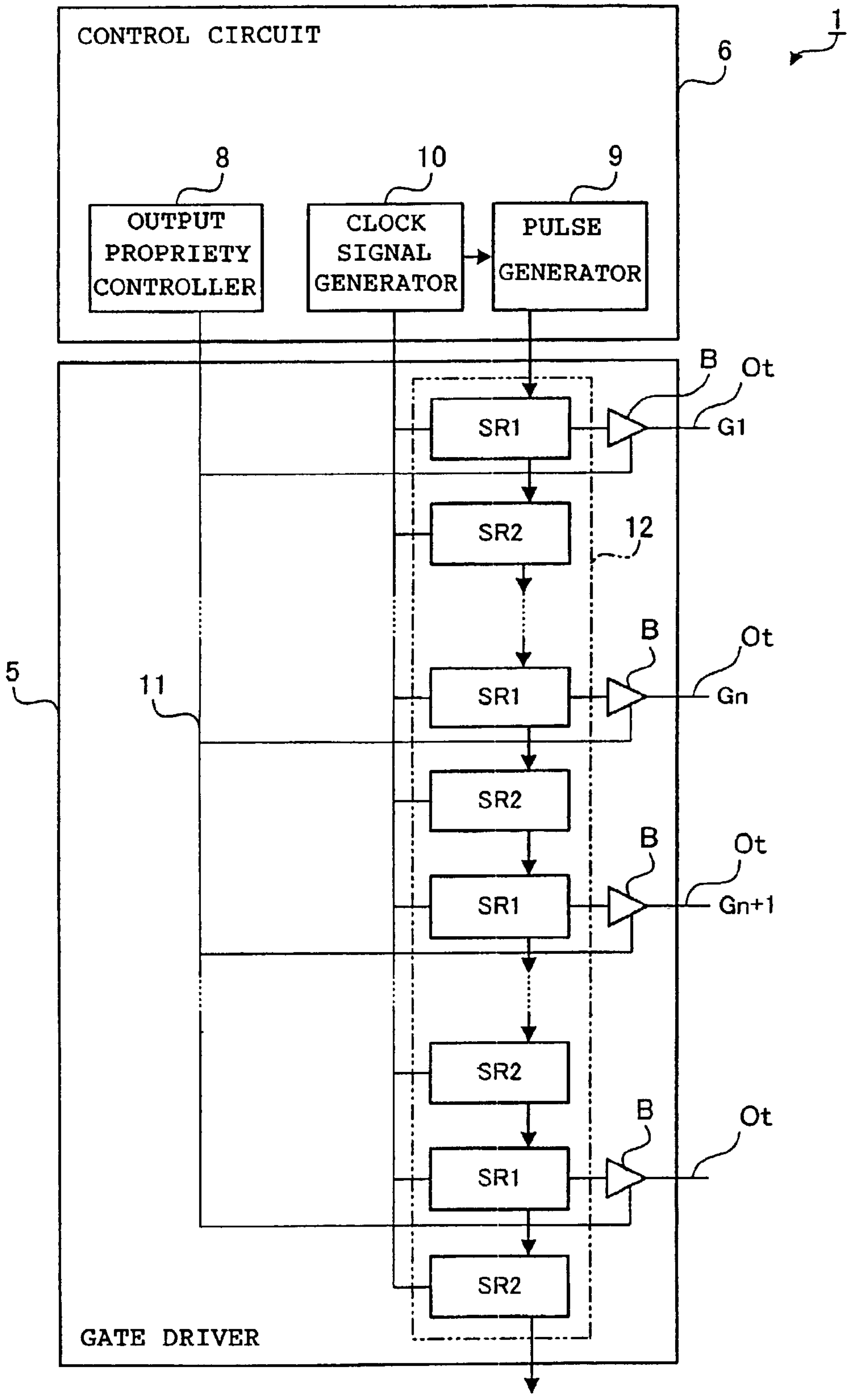
FIG. 1 is a block diagram of a control circuit and a gate driver showing relevant parts of a first embodiment of the present invention.
Figure 2:
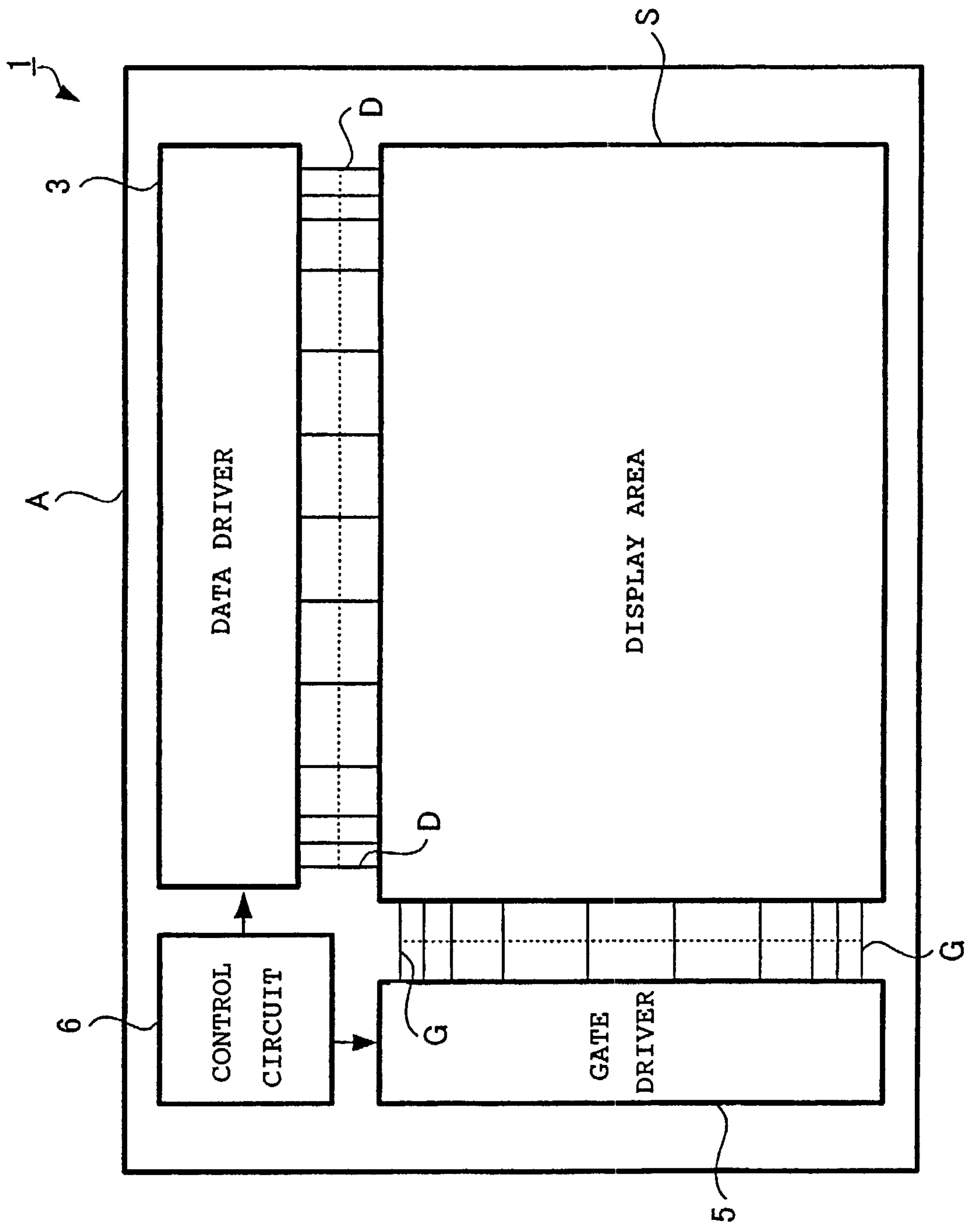
FIG. 2 is a block diagram of a liquid crystal display device adopting the present invention.
Figure 3:
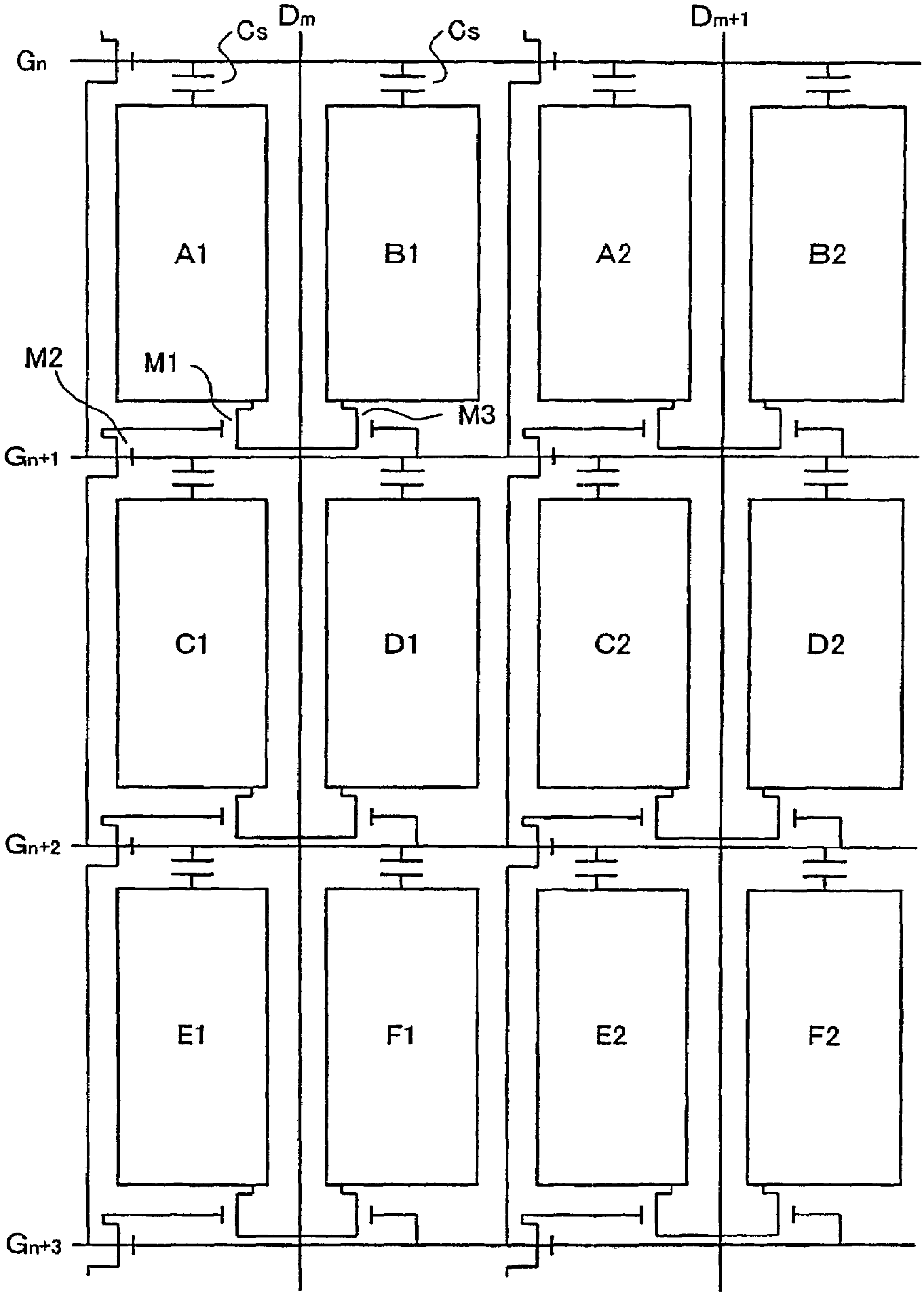
FIG. 3 is a circuit diagram showing a constitution of an array substrate of a liquid crystal display device according to a first embodiment of the present invention.

FIG. 1 is an enlarged block diagram of relevant parts of a liquid crystal display device (an image display device) 1 according to a first embodiment of the present invention. FIG. 2 is a block diagram of liquid crystal display device 1. FIG. 3 is a view showing details of circuit structures in a display area S of an array substrate A of liquid crystal display device 1.

As shown in FIG. 2, liquid crystal display device 1 of this embodiment includes display area S in the array substrate A thereof for displaying images. Moreover, liquid crystal display device 1 includes a data driver 3 for supplying display signals with respect to pixel electrodes arrayed within display area S via signal lines D, a gate driver (a scan line drive circuit or a driver circuit for a display device) 5 for supplying scanning signals for controlling on/off with respect to thin-film transistors formed within display area S via scan lines G, and a control circuit (a scan line driver circuit) 6 for controlling data driver 3 and gate driver 5.

In display area S, the pixel electrodes as many as M (multiplied by) N (M and N are arbitrary integers) are arrayed in a matrix fashion.

As shown in FIG. 3, in display area S of array substrate A, three thin-film transistors (TFTs), namely, a first TFT M1, a second TFT M2 and a third TFT M3 relevant to two pixel electrodes A1 and B1 that are adjacent to each other across a signal line Dm, are disposed as described below.

To begin with, a source electrode of the first TFT M1 is connected with the signal line Dm and a drain electrode thereof is connected with the pixel electrode A1. Meanwhile, a gate electrode of the first TFT M1 is connected with a source electrode of second TFT M2. Here, each TFT is a switching element with three terminals. There is a case that one side connected with a signal line is referred to as a source electrode while another side connected with a pixel electrode is referred to as a drain electrode, However, there is also a case to refer the electrodes in reverse. That is to say, it is not universally settled as to which one of the two electrodes except a gate electrode should be referred to as a source electrode or a drain electrode. Accordingly, the two electrodes except the gate electrode will be hereinafter collectively referred to as source/drain electrodes.

One of source/drain electrodes of second TFT M2 is connected with the gate electrode of first TFT M1, and the other source/drain electrode thereof is connected with a scan line Gn+2. Therefore, the gate electrode of first TFT M1 is connected with scan line Gn+2 via second TFT M2. Meanwhile, a gate electrode of second TFT M2 is connected with a scan line Gn+1. Therefore, first TFT M1 is turned on solely at a moment that the two adjacent scan lines Gn+1 and Gn+2 have selective potential concurrently, whereby electric potential of signal line Dm is supplied to pixel electrode A1. This fact indicates that second TFT M2 controls on/off of first TFT M1.

One of source/drain electrodes of third TFT M3 is connected with signal line Dm, and the other source/drain electrode thereof is connected with pixel electrode B1. Meanwhile, a gate electrode of third TFT M3 is connected with scan line Gn+1. Therefore, third TFT M3 is turned on when scan line Gn+1 has selective potential, whereby the electric potential of signal line Dm is supplied to pixel electrode B1.

The circuit structure of the array substrate A has been described so far from viewpoints of the first TFT M1 to third TFT M3. Now, description will be made regarding the circuit structure of array substrate A from viewpoints of pixel electrode A1 and pixel electrode B1. The display signal is supplied to pixel electrode A1 and pixel electrode B1 from single signal line Dm. That is, signal line Dm can be deemed as a common signal line Dm with respect to pixel electrode A1 and pixel electrode B1. Accordingly, whereas the pixels are arrayed in the matrix composed of M (multiplied by) N, signal lines D consist of N/2 lines.

First TFT M1 and second TFT M2 are connected with pixel electrode A1. Accordingly, first TFT M1 is connected with signal line Dm and with second TFT M2 at the same time. Gate electrode of second TFT M2 is connected with scan line Gn+1 subsequent to pixel electrode A1, and one of the source/drain electrodes of second TFT M2 is connected with scan line Gn+2 subsequent to scan line Gn+1. Here, in order to supply the electric potential of signal line Dm to pixel electrode A1, first TFT M1 must be turned on. Moreover, the gate electrode of first TFT M1 is connected with the source/drain electrode of second TFT M2; the gate electrode of second TFT M2 is connected with proper scan line Gn+1; and the source/drain electrode thereof is connected with subsequent scan line Gn+2. Accordingly, second TFT M2 must be turned on in order to turn on first TFT M1. Scan line Gn+1 and scan line Gn+2 must be selected concurrently in order to turn on second TFT M2. Therefore, first TFT M1 and second TFT M2 collectively constitute a switching mechanism which allows passage of a scanning signal in the event that both of scan line Gn+1 and scan line Gn+1 are selected. Eventually, pixel electrode A1 is driven and receives the electric potential from signal line Dm, based on a scanning signal from scan line Gn+1 and a scanning signal from scan line Gn+2.

Third TFT M3 is connected with pixel electrode B1, and the gate electrode thereof is connected with scan line Gn+1. Therefore, the electric potential is supplied from signal line Dm to pixel electrode A2 when proper scan line Gn+1 is selected.

Although description has been made so far regarding pixel electrode A1 and pixel electrode B1, a similar structure is also applied with respect to pixel electrode A2 and pixel electrode B2, a pixel electrode C1 and a pixel electrode D1, a pixel electrode C2 and a pixel electrode D2 and to other relevant combinations of pixels thereon.

Next, description will be made regarding a configuration between gate driver 5 and control circuit 6 with reference to FIG. 1.

As shown in FIG. 1, control circuit 6 is provided with an output propriety controller 8, a pulse generator (a signal sequence generator) 9 and a clock signal generator 10. Output propriety controller 8 is provided for outputting output control signals with respect to gate driver 5 via output enable (OE) lines (output control lines) 11, and pulse generator 9 is provided for generating shift pulses (signal sequences) to be inputted as scanning signals from gate driver 5 with respect to scan lines G. Meanwhile, clock signal generator 10 is provided for outputting clock signals to drive gate driver 5. Note that clock signal generator 10 is designed as controllable of timing of a leading edge and a trailing edge regarding an arbitrary pulse. Moreover, among scan lines G connected with same gate driver 5, a scan line G positioned in an n-th row in a scanning direction of a screen will be hereinafter referred to as a scan line Gn.

Gate driver 5 is provided with a shift register unit (a propagation circuit) 12 to which the output control signals, the shift pulses and the clock signals are inputted. Shift register unit 12 has a constitution of a cascade connection of disposing first shift registers SR1 and second shift registers (partial propagation circuits) SR2 alternately. Here, first shift register SR1 is provided for each of the scan lines G and is connected with an output terminal Ot connectable with respect to an input terminal of signal line G via a buffer (an output circuit) B. Meanwhile, second shift register SR2 is disposed between first shift registers SR1 adjacent to each other.

Shift register unit 12 of the above-described constitution functions to transfer a shift pulse outputted from pulse generator 9 serially with respect to first shift registers SR1 and second shift registers SR2 while synchronizing the shift pulse with a clock signal outputted from clock signal generator 10. Meanwhile, buffer B provided between first shift register SR1 and scan line G is turned on when an output control signal, which is a binary signal inputted via OE line 11, is "0" and turned off if the output control signal is "1", thus controlling propriety of outputting a scanning signal from first shift register SR1 to scan line G.

Figure 4:
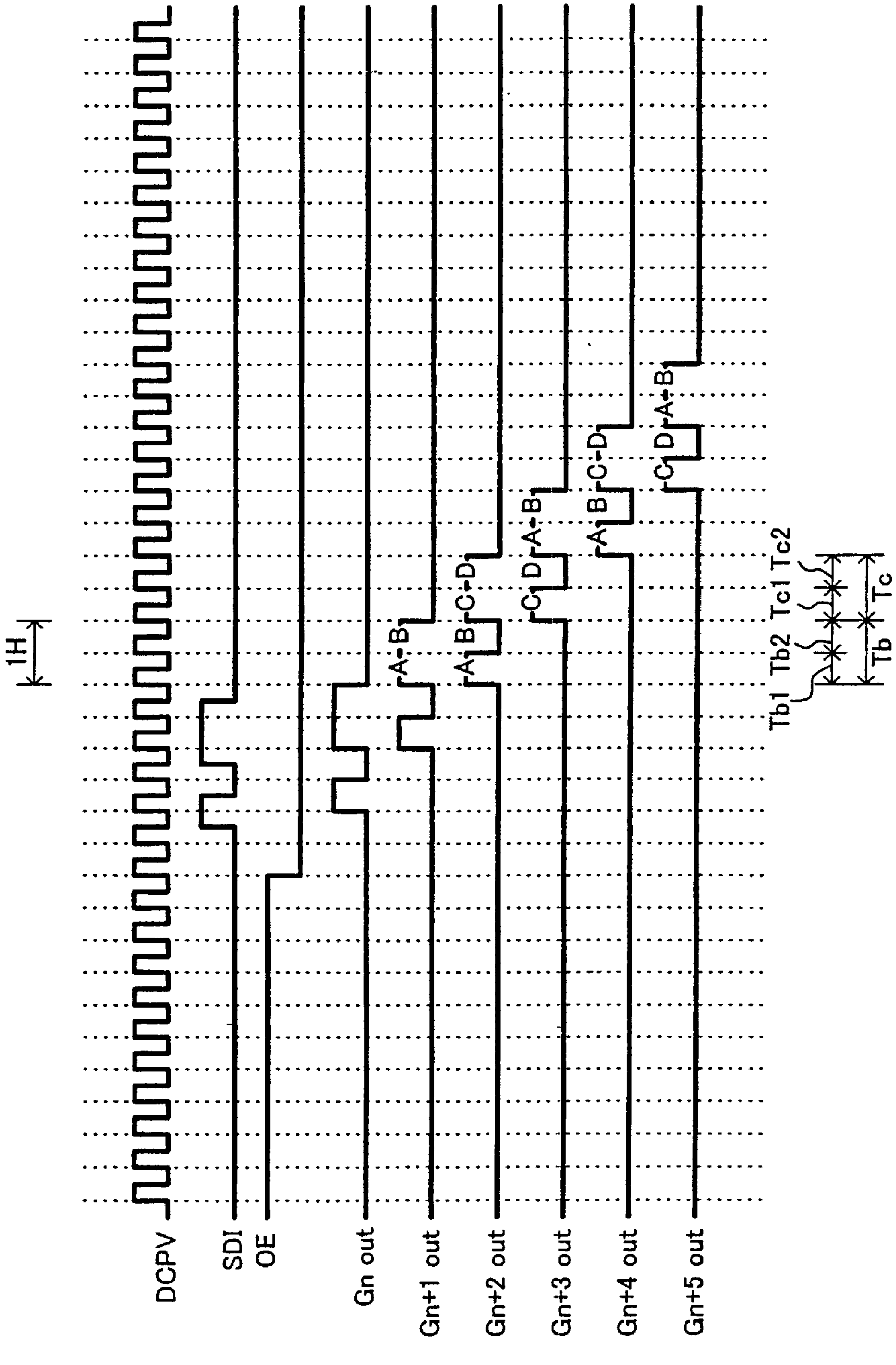
FIG. 4 is a timing chart of a clock signal, a shift pulse and scan signals of the liquid crystal display device according to said first embodiment of the present invention.
Figure 5:
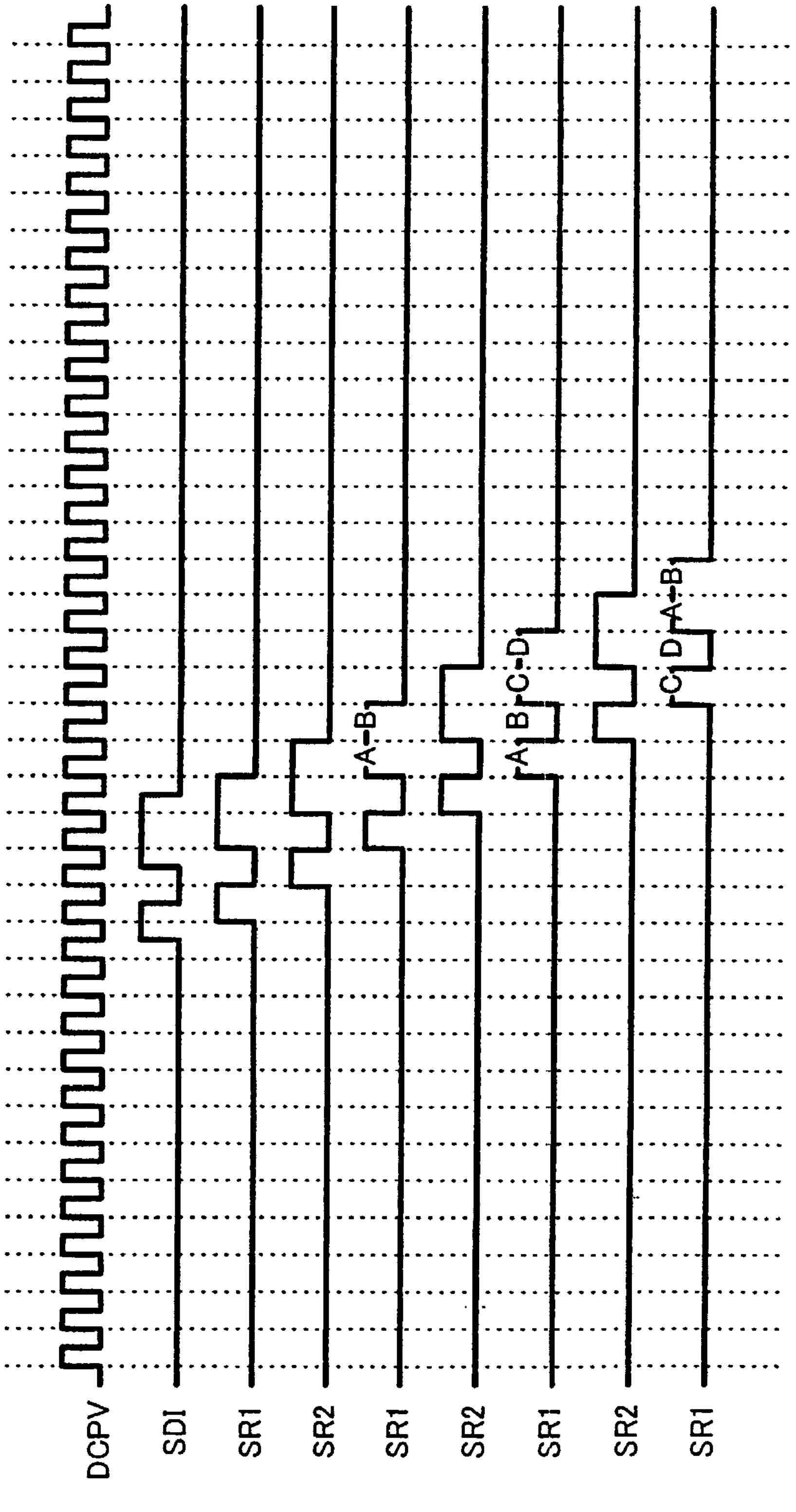
FIG. 5 is a timing chart of propagation of the shift pulse of the liquid crystal display device according to said first embodiment of the present invention.

Next, description will be made regarding operations of this liquid crystal display device 1 with reference to a timing chart of scanning signals shown in FIG. 4, a timing chart of shift pulses as shown in FIG. 5 and circuit diagrams as shown in FIG. 6 to FIG. 9.

In FIG. 4, lines GnOut to Gn+5Out relate to waveforms of the scanning signals to be outputted to scan lines Gn to Gn+5. In other words, the relevant scan lines G are selected in the portions where these lines rise up, and scan lines G are not selected in other portions. Moreover, line OE in FIG. 4 shows a waveform of the output control signal to be supplied to OE line 11. Furthermore, in FIG. 4 and FIG. 5, a line DCPV shows a waveform of the clock signal generated by clock signal generator 10, and a line SDI shows a waveform of the shift pulse generated by pulse generator 9.

Moreover, in FIG. 4, reference numeral 1H denotes a scanning cycle (one horizontal scanning cycle) of one pixel row within display area S. As shown in the drawing, clock signal DCPV is generated such that two cycles thereof correspond to one horizontal scanning cycle (1H). On the other hand, as shown in the drawing, shift pulse SDI has a time width (a time period from a leading edge to a trailing edge thereof) equivalent to a length of two horizontal scanning cycles (2H). Moreover, shift pulse SDI is composed of 4 (2 (multiplied by) 2) signals for setting on/off in every cycle of the clock signal DCPV.

As shown in FIG. 5, when the shift pulse SDI is generated by pulse generator 9, this shift pulse SDI is transferred serially to first shift registers SR1 and second shift registers SR2. Here, shift pulse SDI is transferred serially between the cascade-connected first shift register SR1 and second shift register and so on in every cycle of clock signal DCPV. Accordingly, shift pulses SDI inside first shift register SR1 and second shift register SR2 adjacent to each other constitute a state of being shifted serially by one cycle of clock signal DCPV as shown in FIG. 5.

Nevertheless, second shift register SR2 is not connected with scan line G but first shift register SR1 is solely in a state of outputting the scanning signal with respect to scan line G. Therefore, if output control signal OE is "0", then as shown in FIG. 4, the scanning signal will be outputted serially to scan lines G in the state of being delayed by two cycles of clock signal DCPV, that is, one horizontal scanning cycle (1H) at each time an n value changes by one notch.

Accordingly, if the time width of shift pulse SDI is defined as the length equivalent to two horizontal scanning cycles (2H) as shown in FIG. 4, then considering a first scan line set consisting of scan lines Gn+1 and Gn+2 adjacent to each other, for example, a time period Tb for outputting scanning signals Gn+1Out and Gn+2Out to both of the scan lines Gn+1 and Gn+2 will last for one horizontal scanning cycle (1H). In other words, in time period Tb, it is possible to select pixels connected with both scan lines Gn+1 and Gn+2.

Figure 6:
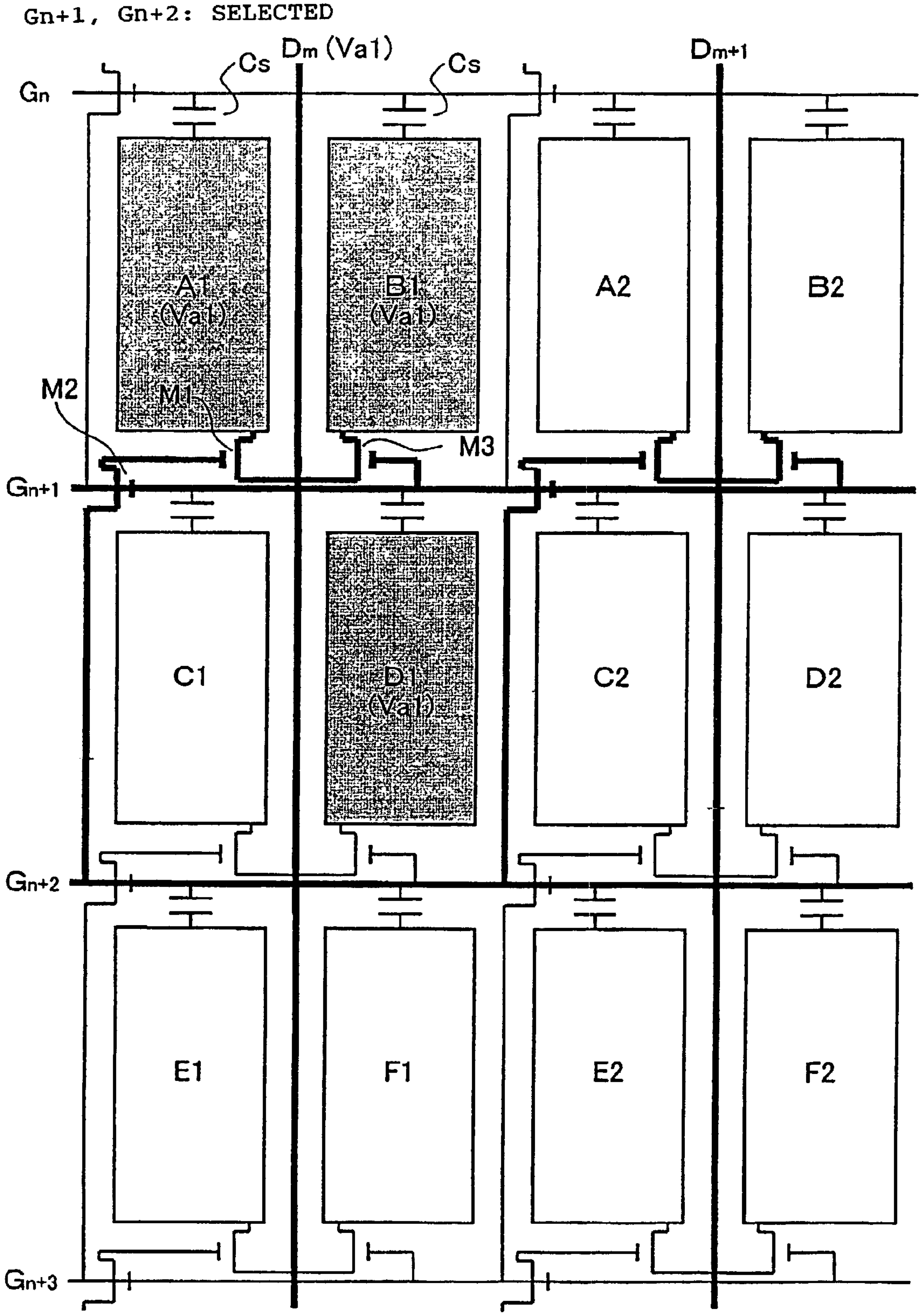
FIG. 6 is a view showing an operation of a circuit of the liquid crystal display device according to said first embodiment of the present invention.

A concrete driving method of pixels is as follows. Specifically, if shift pulse SDI has the waveform as shown in FIG. 4, then scanning signals Gn+1Out and Gn+2Out also have the waveforms as shown in FIG. 4. Here in Tb1 (first timing) which is the former half of the time period Tb, both scan lines Gn+1 and Gn+2 (a first scan line group) are selected first, whereby first TFT M1 to third TFT M3 are turned on as shown in FIG. 6. In this way, electric potential Va1 to be given by signal line Dm to pixel electrode A1 is supplied to pixel electrode A1, pixel electrode B1 and pixel electrode D1, whereby electric potential Va1 of pixel electrode A1 is decided. Note that the state of selection of scan line Gn+1 and scan line Gn+2 is illustrated by bold lines in FIG. 6.

Figure 7:
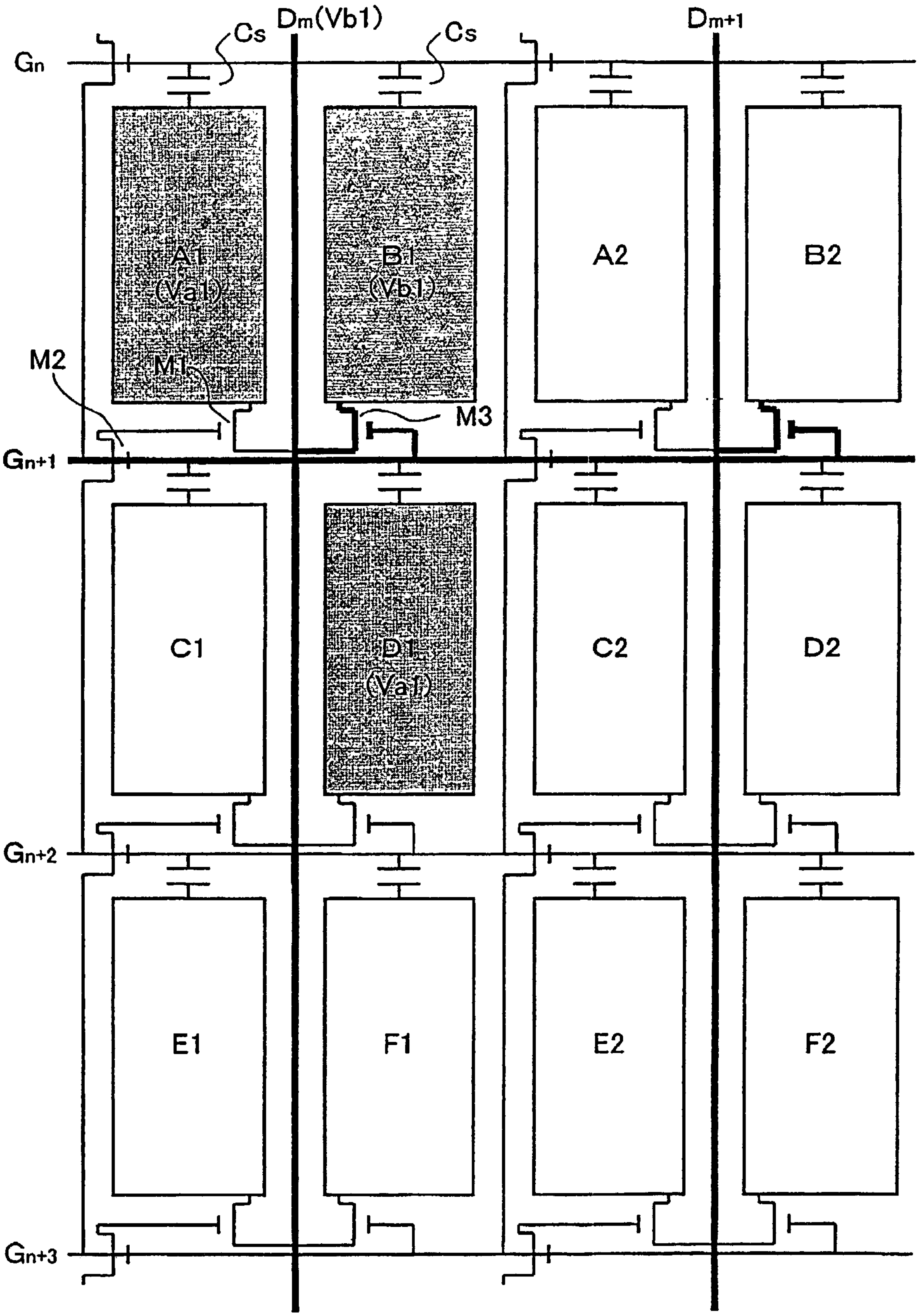
FIG. 7 is another view showing an operation of the circuit of the liquid crystal display device according to said first embodiment of the present invention, showing a subsequent step to FIG. 6.

On the contrary, in Tb2 (second timing) which is the latter half of time period Tb, scan line Gn+2 is set to non-selective electric potential and scan line Gn+1 (a second scan line group) is solely selected. Accordingly, third TFT M3 is solely turned on as shown in FIG. 7. Here, the electric potential supplied from signal line Dm changes into electric potential Vb1 to be given to pixel electrode B1, and the electric potential of pixel electrode B1 is decided accordingly. In this way, it is possible to supply the electric potential of signal line Dm to pixel electrode A1 and pixel electrode B1 by time division.

After scan line Gn+1 is set to the non-selective electric potential, the electric potential of signal line Dm changes into electric potential Vc1 to be given to pixel electrode C1.

Figure 8:
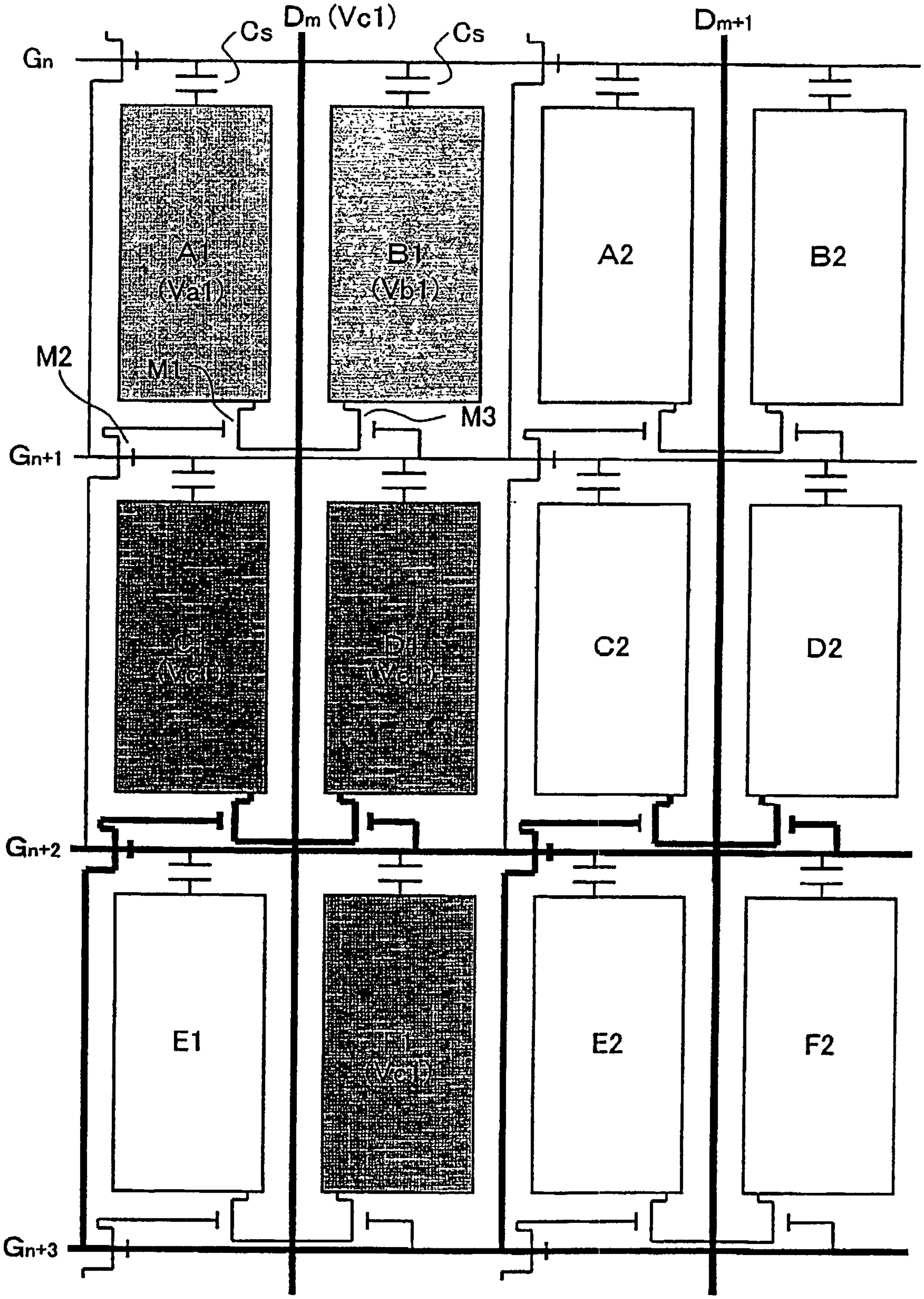
FIG. 8 is another view showing an operation of the circuit of the liquid crystal display device according to said first embodiment of the present invention, showing a subsequent step to FIG. 7.

Here in FIG. 4, considering a second scan line set consisting of scan lines Gn+2 and Gn+3 shifted from scan lines Gn+1 and Gn+2 by one line and focusing on signals to be outputted to this second scan line group, time period Tc for outputting scanning signals Gn+2Out and Gn+3Out to both scan lines Gn+2 and Gn+3 will last for one horizontal scanning cycle (1H) after time period Tb. Therefore, in Tc1 (first timing) which is the former half of time period Tc, both scan lines Gn+2 and Gn+3 are selected, whereby electric potential Vc1 to be given from signal line Dm to pixel electrode C1 is supplied to pixel electrode C1, pixel electrode D1 and pixel electrode F1 as shown in FIG. 8, and electric potential Vc1 of pixel electrode C1 is decided accordingly.

Figure 9:
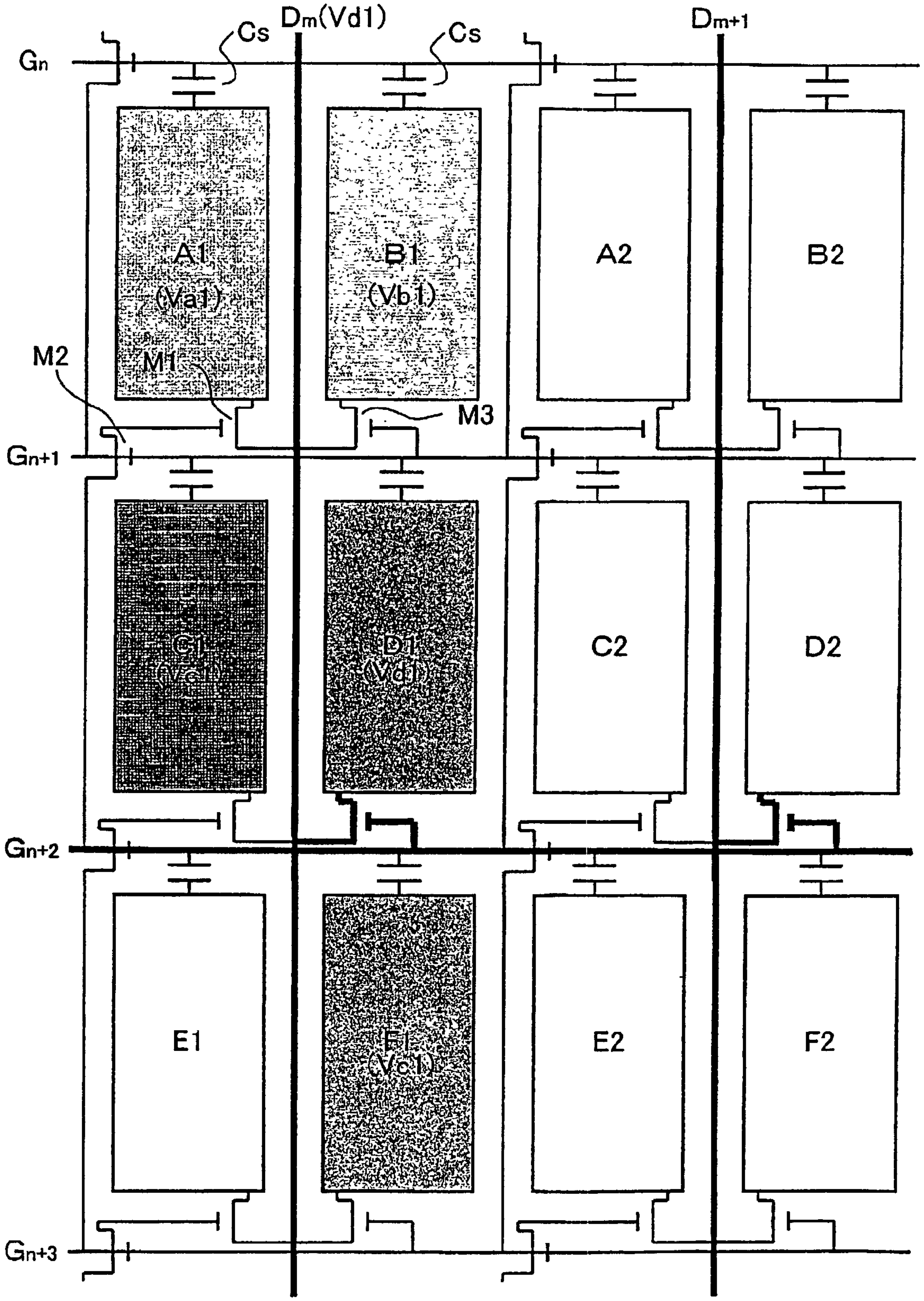
FIG. 9 is another view showing an operation of the circuit of the liquid crystal display device according to said first embodiment of the present invention, showing a subsequent step to FIG. 8.

Moreover, in Tc2 (second timing) which is the latter half of time period Tc, scan line Gn+3 is set to the non-selective electric potential and scan line Gn+2 is solely selected. Therefore, as shown in FIG. 9, the electric potential to be supplied from signal line Dm changes into electric potential Vd1 to be given to pixel electrode D1, whereby electric potential Vd1 is supplied to pixel electrode D1 and the electric potential of pixel electrode D1 is decided accordingly.

As described above, according to the first embodiment, buffers B are provided corresponding to each of scan lines G, and shift register unit 12 is formed by cascade connection of alternate arrangement of first shift registers SR1 and second shift registers SR2. Moreover, buffers B are connected solely with first shift registers SR1 in shift register unit 12 and shift pulse SDI is serially propagated with respect to cascade-connected first shift registers SR1 and second shift registers SR2, whereby shift pulse SDI is supplied to each buffer B. Further in this case, shift register unit 12 is driven by clock signal DCPV having a H/2 cycle dividing one horizontal scanning cycle 1H with a multiplex rate "2" of the pixels, whereby the shift pulse SDI is propagated serially from alternately disposed first registers SR1 to respective buffers B in a time interval 1H shorter than time width 2H of shift pulse SDI. According to the constitution as described above, it is possible to select two scan lines G adjacent to each other simultaneously for a period of 1H. That is, driving of pixel electrodes A1 and B1 (C1 and D1, and so on) can be controlled within one horizontal scanning cycle (1H) by supplying scanning signals Gn+1Out and Gn+2Out (Gn+2Out and Gn+3Out) from two scan lines of Gn+1 and Gn+2 (Gn+2 and Gn+3).

Therefore, unlike the prior art, it is not necessary to arrange two systems of scan lines G or to provide two systems of OE lines 11 in order to control driving of pixel electrodes A1, B1 and the like, but control can be performed by supplying the same output control signal OE with the same OE line 11. In other words, it is possible to select a plurality of scan lines G simultaneously without complicating the control of buffers B with output control signal OE or a structure of gate driver 5, whereby the structure of liquid crystal display device 1 having the multiplex pixel structure can be simplified and facilitation of fabrication as well as reduction of costs can be achieved.

Particularly, according to the first embodiment, shift pulse SDI is set up to turn on and off in every cycle of clock signal DCPV, that is, in every H/2 cycle obtained by time division of one horizontal scanning cycle 1H by the multiplex rate of the pixels. At the same time, the time width of shift pulse SDI is set to 2H, which is a time width equal to addition of a 1H time period (an additional time period) to one horizontal scanning cycle 1H (a time width obtained by one horizontal scanning cycle 1H multiplied by the multiplex rate "2"). Moreover, a time interval of shift pulse SDI propagating between respective buffers B is set as twice the cycle of clock signal DCPV or as 1H. Therefore, it is possible to set a time period of 1H for effectuating simultaneous supply of the scan signal to adjacent scan lines G, and it is also possible to control driving of pixel electrodes A1 and B1 (C1 and D1, and so on) in every H/2 time period within 1H cycle. In this way, liquid crystal display device 1 having the multiplex (2:1) pixel structure can be favorably realized.

Description has been heretofore made regarding the first embodiment of the present invention. However, the present invention is not limited to the above-described first embodiment, as other embodiments can be adopted.

For example, in the above-described first embodiment, clock signal DCPV operates to generate a signal of a uniform frequency. However, without limitations to the foregoing, clock signal generator 10 may generate clock signal DCPV of an uneven frequency by varying timing of a leading edge or a trailing edge of each pulse of such clock pulse DCPV.

Specifically, in the case that pixel electrodes A1 and B1 within display area S shown in FIG. 3 are focused, two TFTs of first TFT M1 and second TFT M2 are attached to pixel electrode A1, but only one TFT (third TFT M3) is attached to pixel electrode B1. Therefore, pixel electrodes A1 and B1 have different characteristics. Accordingly, it is deemed preferable to alter writing time periods relevant to these pixel electrodes.

Therefore, timing of clock signal DCPV at the leading edge or the trailing edge thereof is varied within a range of a given cycle (within one horizontal scanning cycle (1H), for example), whereby the timing of the scanning signal is varied. In this way, it is possible to alter the writing time periods depending on pixel electrodes A1 or B1, whereby pixel electrodes A1 and B1 can be charged properly.

In addition to the foregoing example, the constitution cited in the above-described embodiment may be partially selected, omitted or modified to another constitution to the extent not deviating from the gist of the present invention.

Next, description will be made regarding a second embodiment of the present invention.

Figure 10:
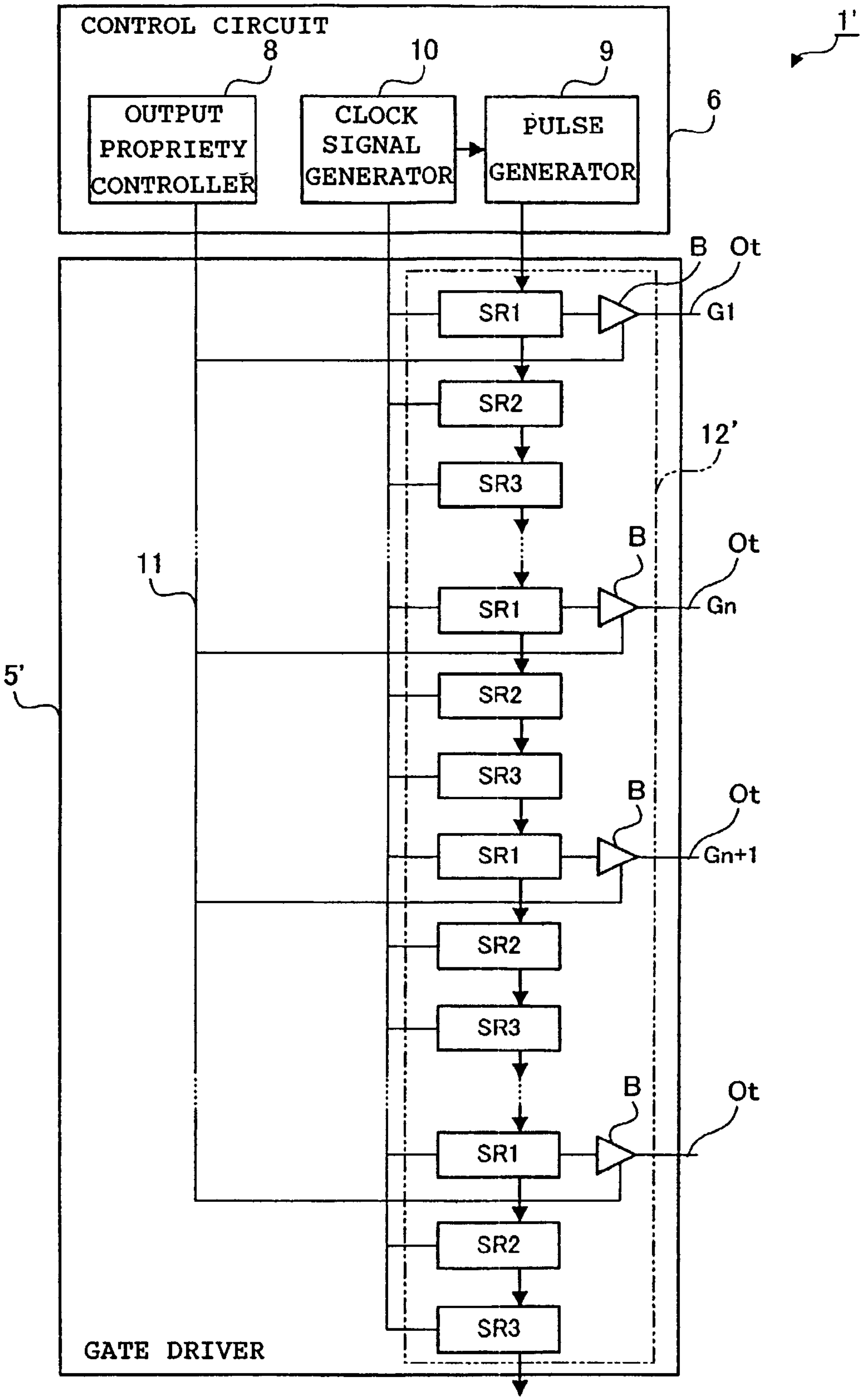
FIG. 10 is a block diagram of a control circuit and a gate driver showing relevant parts of a second embodiment of the present invention.
Figure 11:
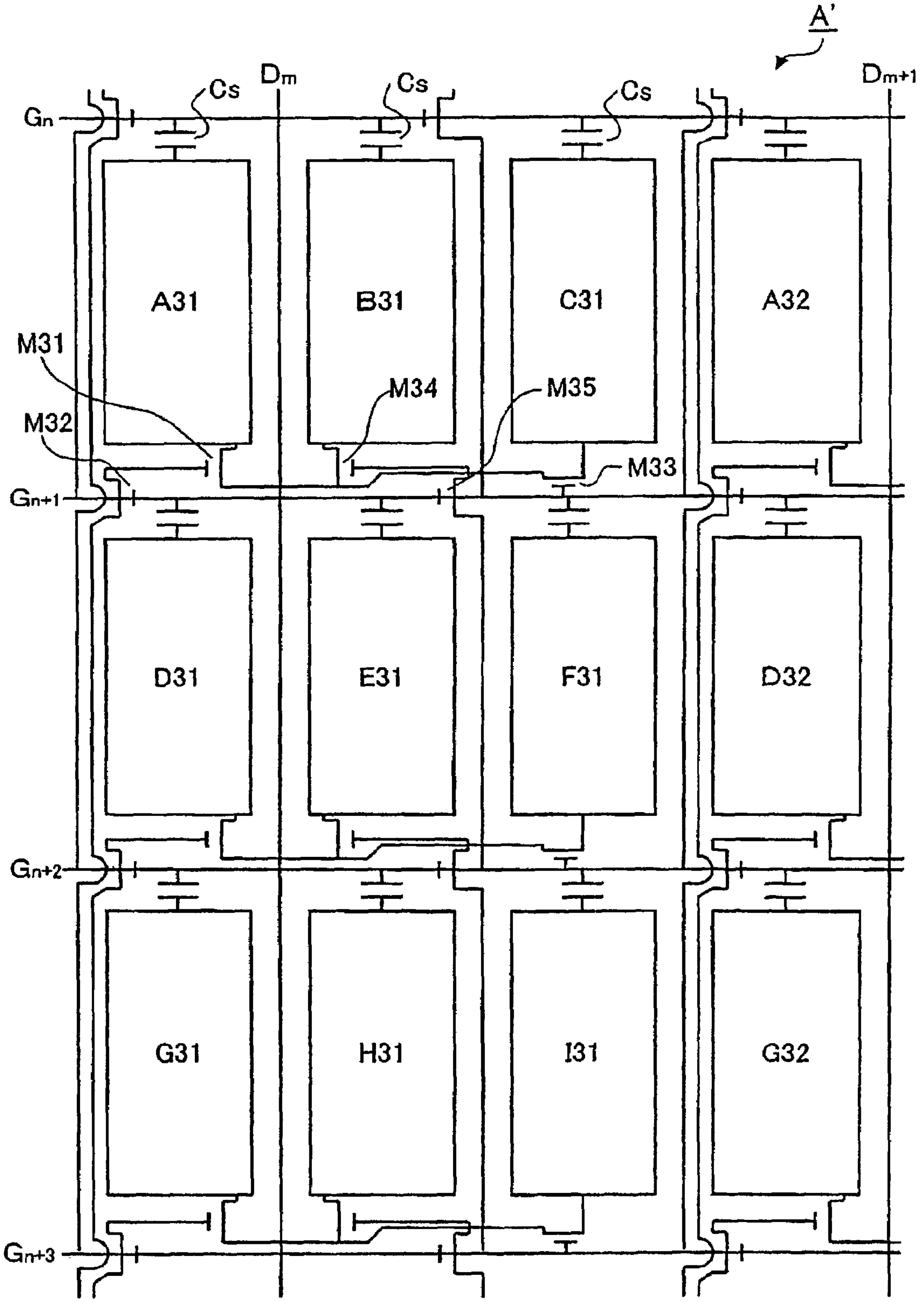
FIG. 11 is a circuit diagram showing a constitution of an array substrate of a liquid crystal display device according to said second embodiment of the present invention.

FIG. 10 is an enlarged block diagram of relevant parts of a liquid crystal display device (an image display device) 1' according to the second embodiment of the present invention. FIG. 11 is a view showing details of circuit structures in a display area S of an array substrate A' of the liquid crystal display device 1'. Note that a constitution of liquid crystal display device 1' of this second embodiment possesses some similarities as that of the foregoing liquid crystal device 1 of the first embodiment shown in FIG. 2. Accordingly, in this second embodiment, description will be made primarily to differences from the above-described first embodiment.

In the above-described first embodiment, two pixels share one signal line Dm in common. On the contrary, in this second embodiment, three pixels share one signal line Dm in common.

Specifically, in array substrate A' of liquid crystal display device 1', signal line Dm is shared in common by three pixels as shown in FIG. 11, namely, by a pixel electrode A31 (a pixel electrode D31, a pixel electrode G31, or the like), a pixel electrode B31 (a pixel electrode E31, a pixel electrode H31, or the like) and a pixel electrode C31 (a pixel electrode F31, a pixel electrode I31, or the like). Moreover, data electric potential of signal line Dm is supplied to pixel electrode A31 in the event that both scan line Gn+1 and scan line Gn+3 are set to selective electric potential. Meanwhile, the data electric potential of signal line Dm is supplied to pixel electrode B31 in the event that both scan line Gn+1 and scan line Gn+2 are set to selective electric potential. Furthermore, the data electric potential of signal line Dm is supplied to pixel electrode C1 in the event that scan line Gn+1 is set to selective electric potential.

In order to perform the above-described operations, the second embodiment sets up disposition of first TFT M31 to fifth TFT M35 as switching elements as described below.

Specifically, as shown in FIG. 11, one of source/drain electrodes of first TFT M31 is connected with pixel electrode A31 and the other source/drain electrode thereof is connected with signal line Dm. Meanwhile, a gate electrode of first TFT M31 is connected with a source/drain electrode on second TFT M32.

One of source/drain electrodes of second TFT M32 is connected with scan line Gn+3 and the other source/drain electrode thereof is connected with the gate electrode of first TFT M31. Accordingly, the gate electrode of first TFT M31 is connected with scan line Gn+3 via second TFT M32. Meanwhile, a gate electrode of second TFT M32 is connected with scan line Gn+1.

Therefore, first TFT M31 is turned on only in a period when two scan lines Gn+1 and Gn+3 are set to selective electric potential at the same time, whereby the electric potential of signal line Dm is supplied to pixel electrode A31. This fact indicates that second TFT M32 is the switching element for controlling on/off of first TFT M31.

One of source/drain electrodes of third TFT M33 is connected with signal line Dm and the other source/drain electrode thereof is connected with pixel electrode C31. Meanwhile, a gate electrode of third TFT M33 is connected with scan line Gn+1.

One of source/drain electrodes of a fourth TFT M34 is connected with signal line Dm and the other source/drain electrode thereof is connected with pixel electrode B31. Meanwhile, a gate electrode of fourth TFT M34 is connected with a source/drain electrode of a fifth TFT M35.

Moreover, one of source/drain electrodes of fifth TFT M35 is connected with scan line Gn+2 and the other source/drain electrode thereof is connected with the gate electrode of fourth TFT M34. Accordingly, the gate electrode of fourth TFT M34 is connected with scan line Gn+2 via fifth TFT M35. Meanwhile, a gate electrode of fifth TFT M35 is connected with scan line Gn+1. Therefore, fourth TFT M34 is turned on only in a period when two scan lines Gn+1 and Gn+2 are set to selective electric potential at the same time, whereby the electric potential of signal line Dm is supplied to pixel electrode B31. This fact indicates that fifth TFT M35 is the switching element for controlling on/off of fourth TFT M34.

The circuit structure of array substrate A' has been described above from viewpoints of first TFT M31 to fifth TFT M35. Now, a circuit structure of liquid crystal display device 1' will be described hereunder from viewpoints of pixel electrode A31 to pixel electrode C31.

A display signal is supplied to pixel electrode A31 to pixel electrode C31 from the single signal line Dm. That is, signal line Dm is a signal line common to pixel electrode A31 to pixel electrode C31. First TFT M31 and second TFT M32 are connected with pixel electrode A31, and first TFT M31 is connected with signal line Dm and also connected with second TFT M32. The gate electrode of second TFT M32 is connected with proper scan line Gn+1, and the source/drain electrode of second TFT M32 is connected with the subsequent scan line Gn+3. Here, first TFT M31 needs to be turned on in order to supply the electric potential of signal line Dm to pixel electrode A31. Moreover, the gate electrode of first TFT M31 is connected with the source/drain electrode of second TFT M32; the gate electrode of second TFT M32 is connected with scan line Gn+1 which is positioned subsequent to pixel electrode A1 as well as pixel electrode B1; and the source/drain electrode thereof is connected with scan line Gn+3 which is subsequent to scan line Gn+1. Accordingly, second TFT M32 needs to be turned on in order to turn on first TFT M31. Scan line Gn+1 and subsequent scan line Gn+3 need to be set to selective electric potential in order to turn on second TFT M32. In this way, pixel electrode A31 is driven based on a scanning signal from scan line Gn+1 and a scanning signal from scan line Gn+3, thus receiving the electric potential from signal line Dm.

Fourth TFT M34 and fifth TFT M35 are connected with pixel electrode B31. Fourth TFT M34 is connected with signal line Dm and also connected with fifth TFT M35. The gate electrode of fifth TFT M35 is connected with scan line Gn+1, and the source/drain electrode of fifth TFT M35 is connected with scan line Gn+2. Here, fourth TFT M34 needs to be turned on in order to supply the electric potential of signal line Dm to pixel electrode B31. Moreover, the gate electrode of fourth TFT M34 is connected with the source/drain electrode of fifth TFT M35; and simultaneously, the gate electrode of fifth TFT M35 is connected with scan line Gn+1 and the source/drain electrode thereof is connected with scan line Gn+2. Accordingly, fifth TFT M35 needs to be turned on in order to turn on fourth TFT M34. Scan line Gn+1 and scan line Gn+2 need to be set to selective electric potential in order to turn on fifth TFT M35. As a consequence, the electric potential is supplied from signal line Dm to pixel electrode B1 only when scan line Gn+1 positioned subsequent to pixel electrode B31 itself and subsequent scan line Gn+2 are set to selective electric potential.

In the meantime, third TFT M33 is connected with pixel electrode C31, and the gate electrode thereof is connected with scan line Gn+1. Accordingly, the electric potential is supplied from signal line Dm to pixel electrode C31 when scan line Gn+1 is selected.

Although description has been made in the foregoing regarding pixel electrode A31 to pixel electrode C31, a similar structure is also applied to pixel electrode D31 to pixel electrode F31, pixel electrode G31 to pixel electrode I31, and to other relevant sets of pixels thereon.

Next, description will be made regarding a configuration between a gate driver (a scan line drive circuit or a driver circuit for a display device) 5' and a control circuit (a scan line drive circuit) 6 with reference to FIG. 10.

As shown in FIG. 10, control circuit 6 of this second embodiment includes an output propriety controller 8, a pulse generator (a signal sequence generator) 9 and a clock signal generator 10, as similar to the above-described first embodiment.

Gate driver 5' is provided with a shift register unit (a propagation circuit) 12' to which output control signals, shift pulses and clock signals are inputted. Shift register unit 12' includes first shift registers SR1, each of which is provided corresponding to each scan line G connected with an output terminal Ot connectable with respect to scan line G via a buffer (an output circuit) B. In addition, shift register unit 12' further includes second shift registers SR2 and third shift registers SR3 (partial propagation circuits). Each of these second shift registers SR2 and each of the third shift registers SR3 are provided one by one corresponding to each first shift register SR1 and serially cascade-connected. In other words, one set of first, second and third shift registers SR1, SR2 and SR3 are disposed corresponding to each scan line G, and a plurality of sets of first, second and third shift registers SR1, SR2 and SR3 corresponding to the number of scan lines G are arranged in a state of cascade connection with respect to one another. In this way, shift register unit 12' is made capable of transferring a shift pulse outputted from pulse generator 9 serially with respect to first shift registers SR1, second shift registers SR2 and third shift registers SR3 while synchronizing the shift pulse with a clock signal outputted from clock signal generator 10.

Note that buffer B provided between first shift register SR1 and scan line G has a function similar to that in the above-described first embodiment.

Figure 12:
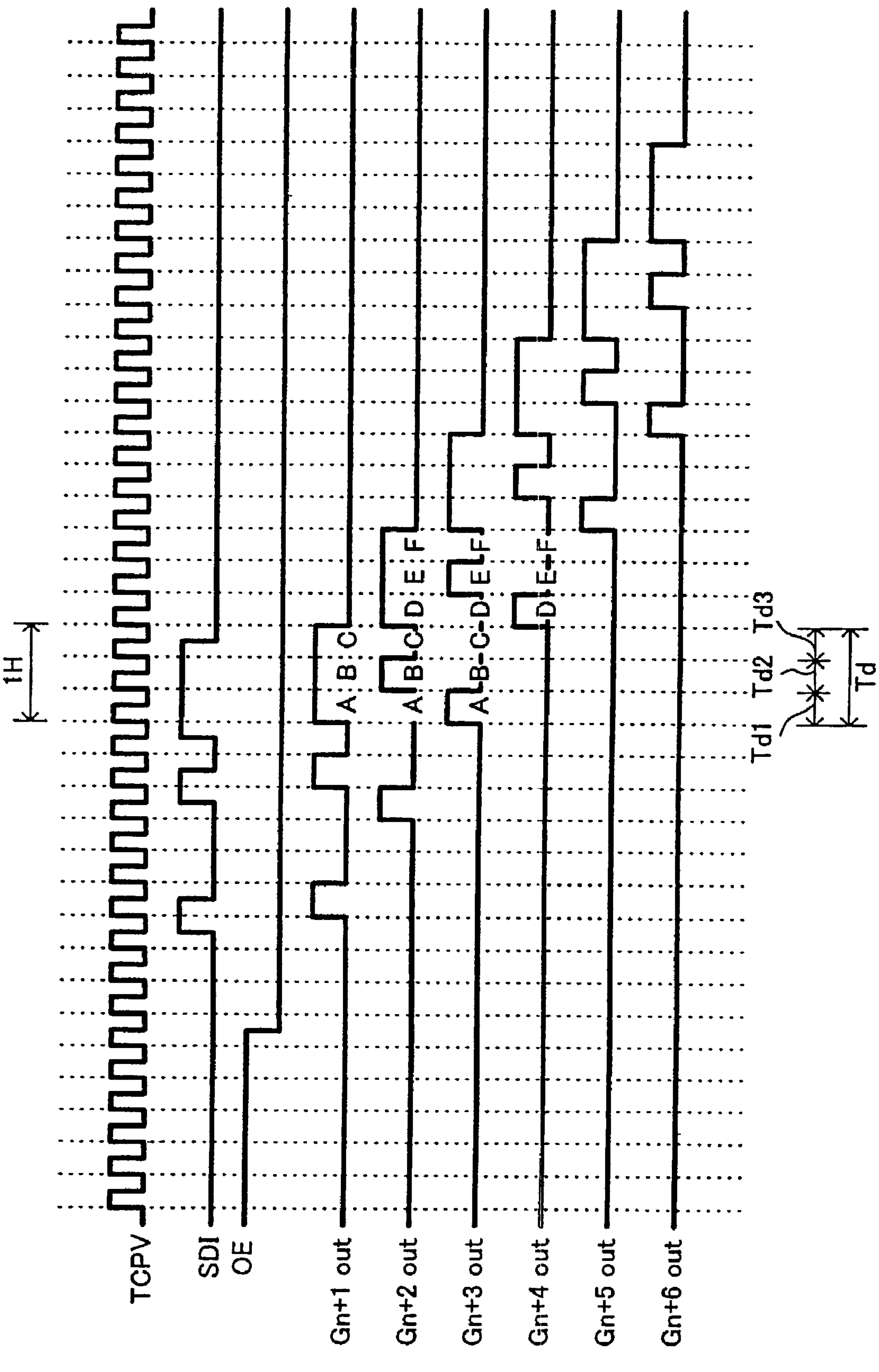
FIG. 12 is a timing chart of a clock signal, a shift pulse and scan signals of the liquid crystal display device according to said second embodiment of the present invention.
Figure 13:
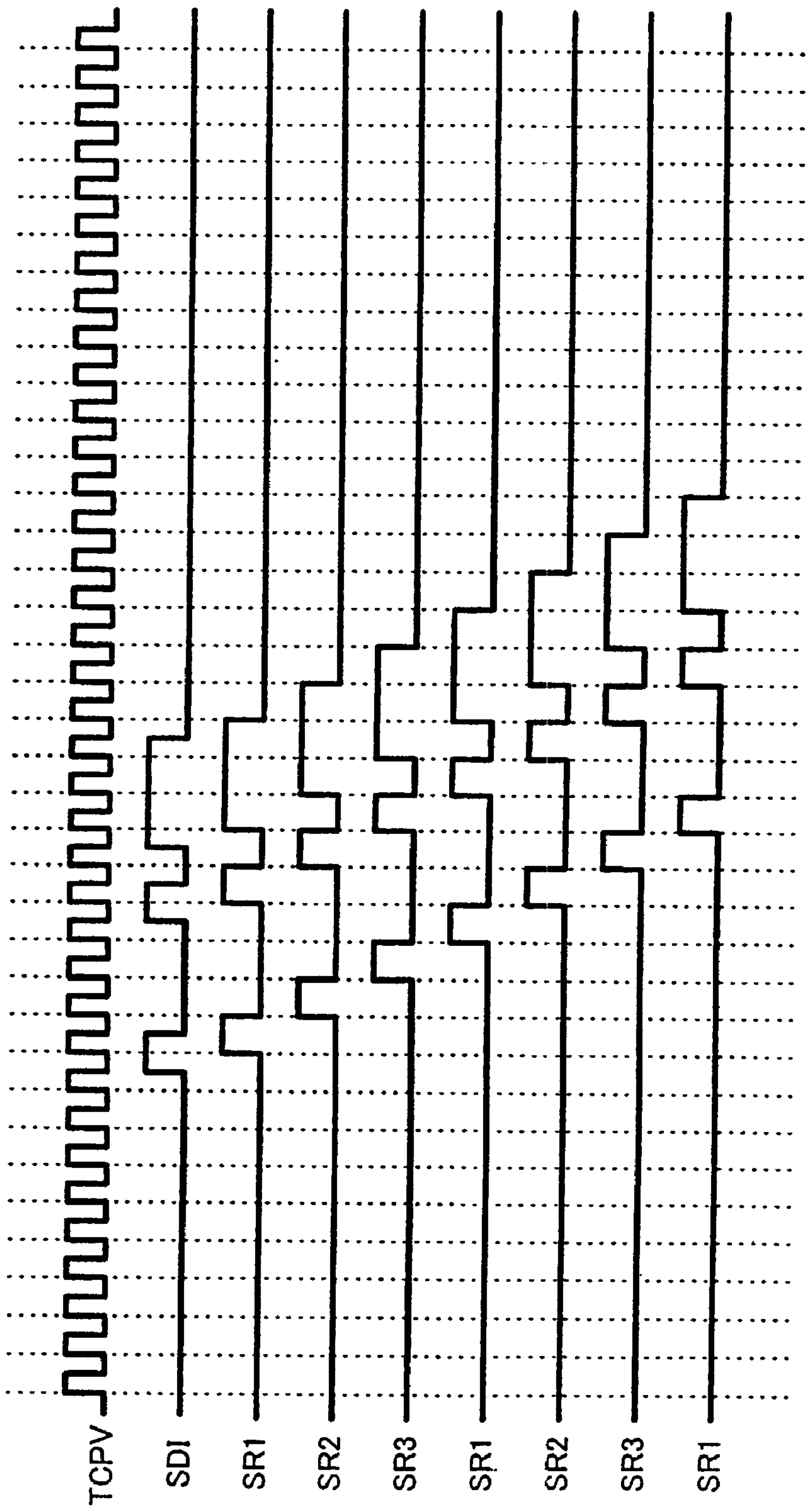
FIG. 13 is a timing chart of propagation of the shift pulse of the liquid crystal display device according to said second embodiment of the present invention.

Next, description will be made regarding operations of this liquid crystal display device 1' with reference to a timing chart of scanning signals as shown in FIG. 12, a timing chart of shift pulses as shown in FIG. 13 and circuit diagrams as shown in FIG. 14 to FIG. 17.

In FIG. 12, lines Gn+1Out to Gn+6Out indicate waveforms of the scanning signals to be outputted to scan lines Gn+1 to Gn+6. In other words, the relevant scan lines G are selected in the portions where these lines rise up, and scan lines G are not selected in other portions. Moreover, line OE in FIG. 12 shows a waveform of the control signal to be supplied to OE line 1. Furthermore, in FIG. 12 and FIG. 13, a line TCPV shows a waveform of the clock signal generated by clock signal generator 10, and a line SDI shows a waveform of the shift pulse generated by pulse generator 9.

Moreover, in FIG. 12, reference numeral 1H denotes a scanning cycle (one horizontal scanning cycle) of one pixel row within a display area S. As shown in the drawing, clock signal TCPV is generated such that three cycles thereof correspond to one horizontal scanning cycle (1H). On the other hand, as shown in the drawing, shift pulse SDI has a time width (a time period from a leading edge to a trailing edge thereof) equivalent to a length of three horizontal scanning cycles (3H). Moreover, shift pulse SDI is composed of 9 (3 (multiplied by) 3) signals for setting on/off in every cycle of clock signal TCPV.

As shown in FIG. 13, when shift pulse SDI is generated by pulse generator 9, this shift pulse SDI is propagated serially to first shift registers SR1, second shift registers SR2 and third shift registers SR3. Here, shift pulse SDI is propagated serially with respect to first shift register SR1, second shift register and third shift register SR3 in every cycle of clock signal TCPV. Accordingly, shift pulses SDI inside first shift register SR1, second shift register SR2 and third shift register SR3 adjacent to one another constitute a state of being shifted serially by one cycle of clock signal TCPV as shown in FIG. 13.

Nevertheless, in this case, second shift register SR2 and third shift register SR3 are not connected with scan line G but first shift register SR1 is solely in a state of outputting the scanning signal with respect to scan line G. Therefore, if OE line 11 is "0", then as shown in FIG. 12, the scanning signal will be outputted serially to the scan lines in the state of being delayed by three cycles of clock signal TCPV, that is, one horizontal scanning cycle (1H) at each time an n value changes by one notch.

Accordingly, if the time width of shift pulse SDI is defined as, for example, the length equivalent to three horizontal scanning cycles (3H), then considering a first scan line set consisting of scan lines Gn+1, Gn+2 and Gn+3 adjacent to one another other, for example, a time period Td for outputting the scanning signals to all the scan lines Gn+1, Gn+2 and Gn+3 will last for one horizontal scanning cycle (1H). In other words, in time period Td, it is possible to select pixels connected with scan lines Gn+1, Gn+2 and Gn+3.

Figure 14:
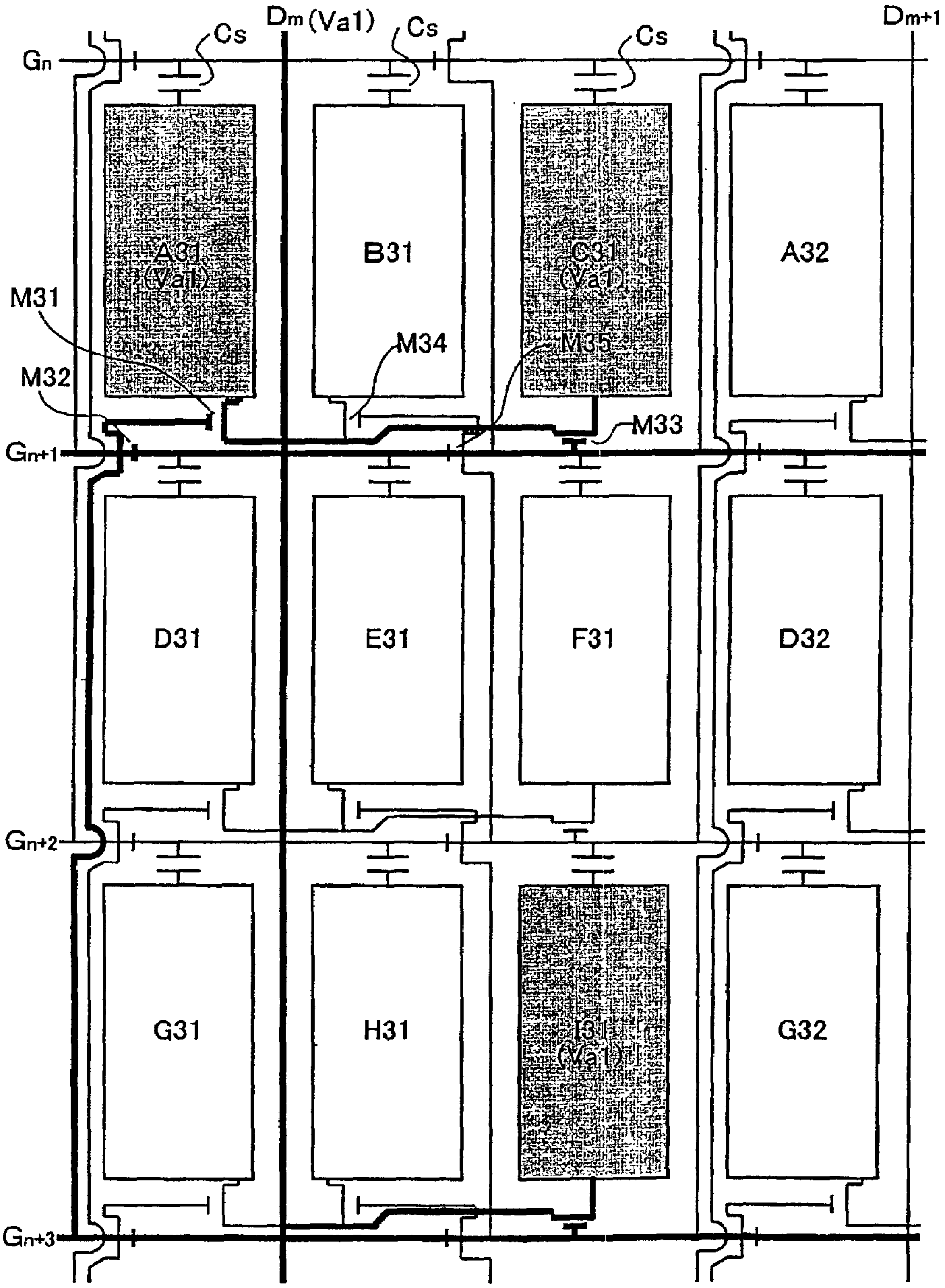
FIG. 14 is a view showing an operation of a circuit of the liquid crystal display device according to said second embodiment of the present invention.

A concrete driving method of pixels is as follows. Specifically, if shift pulse SDI has the waveform as shown in FIG. 12, then scanning signals Gn+1Out, Gn+2Out and Gn+3Out also have the waveforms as shown in FIG. 12. Here in Td1 (first timing) which is the first subperiod in the case of trisecting time period Tb, scan lines Gn+1 and Gn+3 (a first scan line group) are selected first, whereby first TFT M31 to third TFT M33 are turned on. Accordingly, electric potential Va1 to be given by signal line Dm to pixel electrode A31 is supplied to pixel electrode A31, pixel electrode C31 and pixel electrode 131 as shown in FIG. 14. In this way, electric potential Va1 of pixel electrode A31 is decided.

Figure 15:
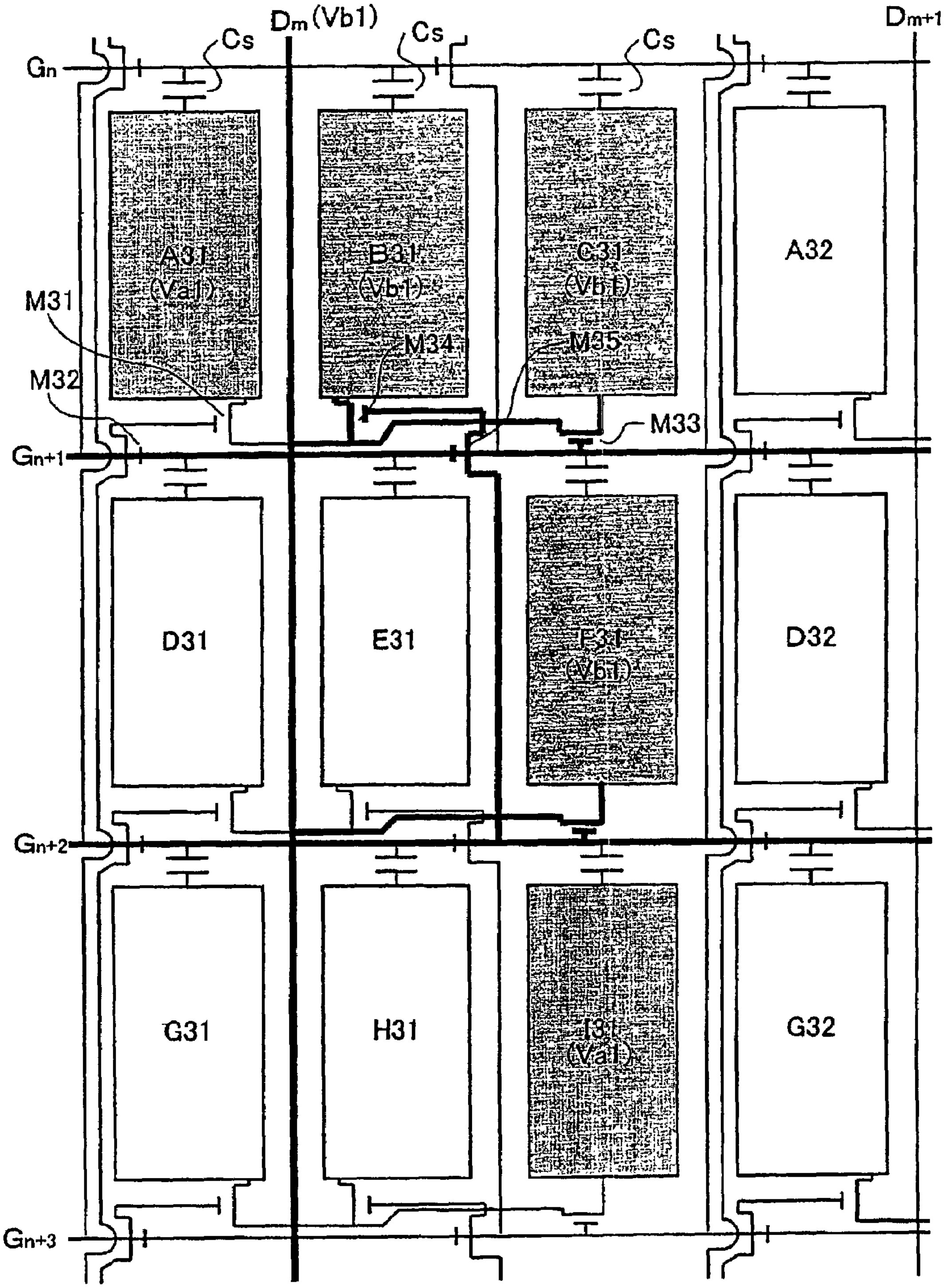
FIG. 15 is another view showing an operation of the circuit of the liquid crystal display device according to said second embodiment of the present invention, showing a subsequent step to FIG. 14.

Thereafter, in Td2 (second timing) which is a subsequent subperiod to period Td1, the electric potential supplied from signal line Dm changes into electric potential Vb1 to be given to pixel electrode B31. Here in subperiod Td2, scan line Gn+1 and scan line Gn+2 (a second scan line group) are selected as shown in FIG. 12, whereby second TFT M32 is turned off as shown in FIG. 15 and first TFT M31 is turned off by supplying electric potential of Gn+3 (off electric potential) to the gate electrode of first TFT M31. In the meantime, third TFT M33 to fifth TFT M35 are turned on. Therefore, electric potential Vb1 is supplied to pixel electrode B31, pixel electrode C31 and pixel electrode F31. In this way, electric potential Vb1 of pixel electrode B31 is decided accordingly.

Figure 16:
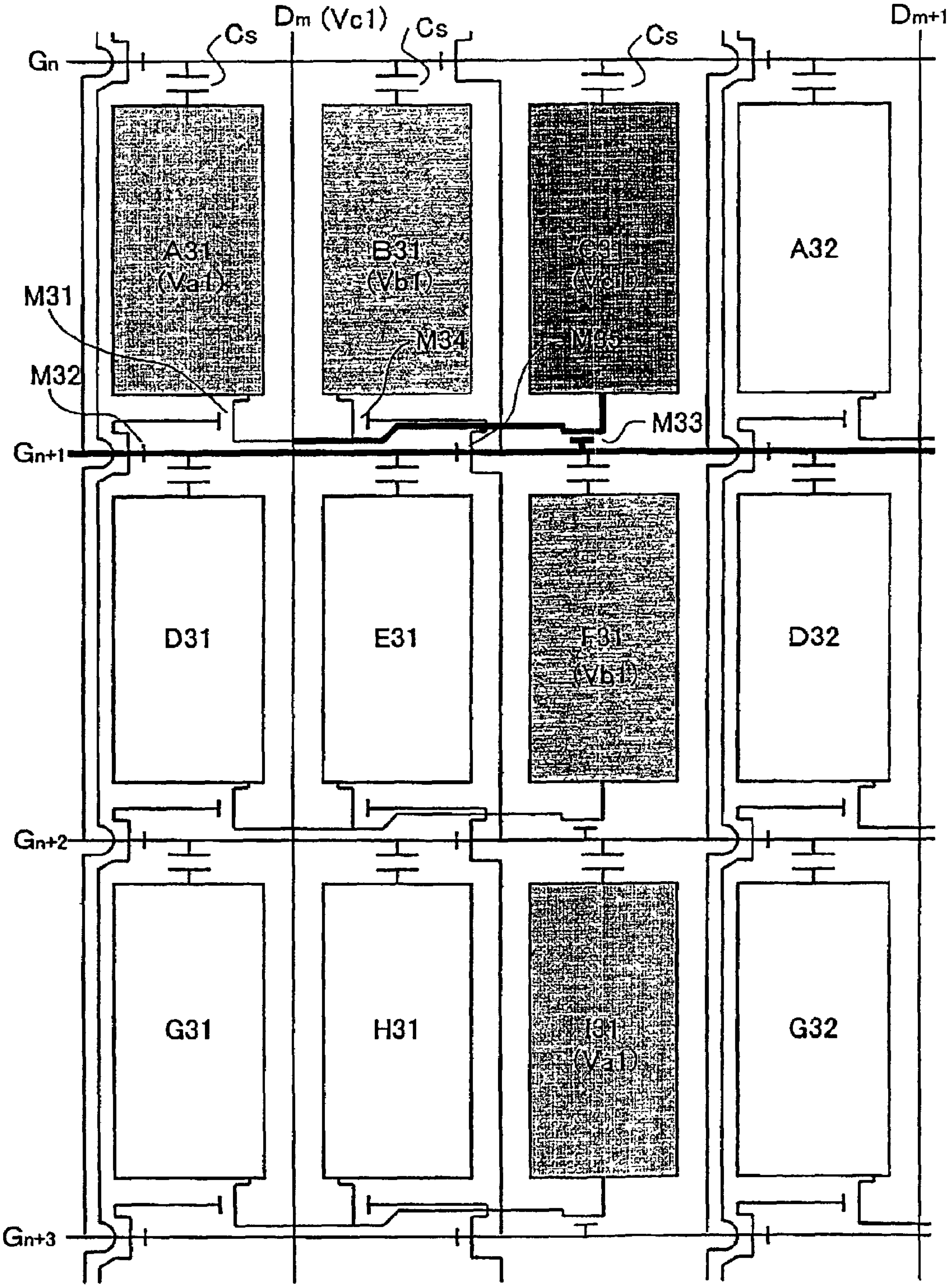
FIG. 16 is another view showing an operation of the circuit of the liquid crystal display device according to said second embodiment of the present invention, showing a subsequent step to FIG. 15.

Furthermore, in Td3 (third timing) which is the last subperiod of time period Td, the electric potential supplied from signal line Dm changes into electric potential Vc1 to be given to pixel electrode C31. Here in subperiod Td3, scan line Gn+1 (a third scan line group) is solely set to selective electric potential as shown in FIG. 12. Therefore, electric potential Vc1 of signal line Dm is given to pixel electrode C31 through third TFT M33 as shown in FIG. 16, whereby electric potential Vc1 of pixel electrode C31 is decided accordingly.

Subsequently, scan line Gn+1 is set to non-selective electric potential, and then the electric potential from signal line Dm changes into electric potential Vd1 to be given to pixel electrode D31 and the process similar to the foregoing is performed on a second scan line set comprised of scan lines Gn+2 to Gn+4 by shifting respective scan lines G from first scan line set Gn+1 to Gn+3 by one line. In this way, electric potential of pixel electrode D31 to pixel electrode F31 is decided by time division. Note that the process with respect to second scan line set Gn+2 to Gn+4 is initiated one horizontal scanning cycle (1H) after the time when the process with respect to first scan line set Gn+1 to Gn+3 is performed.

In addition, a similar process will be performed thereafter with respect to each scan line set shifting the respective scan lines G thereof by one line from the second line set, in every horizontal scanning cycle (1H).

As described above, according to this second embodiment, buffer B is provided corresponding to each of scan lines G, and shift register unit 12' is formed by cascade connection of repeated arrangement of the first, second and third shift registers SR1, SR2 and SR3. Moreover, buffers B are connected solely with first shift registers SR1 in shift register unit 12' and shift pulse SDI is serially propagated with respect to first, second and third shift registers SR1, SR2 and SR3, whereby shift pulse SDI is supplied to each buffer B. Further in this embodiment, shift register unit 12' is driven by clock signal TCPV having a H/3 cycle dividing one horizontal scanning cycle 1H with a multiplex rate "3" of the pixels, whereby shift pulse SDI is propagated serially from first registers SR1 to the respective buffers B in a time interval 1H shorter than time width 3H of shift pulse SDI. According to the constitution as described above, it is possible to select three scan lines G adjacent to one another simultaneously for a period of 1H. That is, driving of pixel electrodes A31, B31 and C31 (D31, E31, and so on) can be controlled within one horizontal scanning cycle (1H) by supplying scanning signals Gn+1Out, Gn+2Out and Gn+3Out (Gn+2Out, Gn+3Out, G+4Out, and so on) from three scan lines of Gn+1, Gn+2 and Gn+3 (Gn+2, Gn+3, Gn+4, and so on).

Therefore, it is not necessary to arrange three systems of scan lines G or to provide three systems of OE lines 11 in order to control driving of pixel electrodes A31, B31, C31 and the like, but control can be performed by supplying the same output control signal OE with the same OE line 11. In other words, it is possible to select a plurality of scan lines G simultaneously without complicating the control of buffers B with output control signal OE or a structure of gate driver 5', whereby the structure of liquid crystal display device 1' having the multiplex pixel structure can be simplified and facilitation of fabrication as well as reduction of costs can be achieved.

Particularly, according to the second embodiment, shift pulse SDI is set up to turn on and off in every cycle of clock signal TCPV, that is, in every H/3 cycle obtained by time division of one horizontal scanning cycle 1H by the multiplex rate of the pixels. At the same time, the time width of shift pulse SDI is set to 3H, which is a time width equal to addition of a 2H time period (an additional time period) to one horizontal scanning cycle 1H (a time width obtained by one horizontal scanning cycle 1H multiplied by multiplex rate "3"). Moreover, a time interval of shift pulse SDI propagating between respective buffers B is set as three times the cycle of clock signal TCPV or as 1H. Therefore, it is possible to set a time period of 1H for effectuating simultaneous supply of the scan signal to three adjacent scan lines G, and it is also possible to control driving of pixel electrodes A31, B31 and C31 (D31, E31 and F1, and so on) in every H/3 time period within 1H cycle. In this way, liquid crystal display device 1' having multiplex (3:1) pixel structure can be favorably realized.

Description has been heretofore made regarding a second embodiment of the present invention. However, as understood, the present invention is not limited to the above-described second embodiment, as other embodiments, e.g., the first cited earlier, can be adopted from time to time as necessary.

For example, also in the above-described second embodiment, clock signal generator 10 may generate clock signal TCPV of an uneven frequency by varying timing of a leading edge or a trailing edge of each pulse of such clock pulse TCPV as similar to the above-described first embodiment.

Moreover, in the above-described second embodiment, liquid crystal display device 1', having a multiplex pixel structure of 3:1 (the pixel structure of selecting three pixels in 1H), is driven. If this multiplex rate herein is defined generally as m, which is an arbitrary natural number equal to or larger than 2, then it is possible to drive a liquid crystal display device having a multiplex pixel structure of m:1 by the present invention. Specifically, between a pair of first shift registers SR1 connected with scan lines G via the buffers B, m−1 pieces of other shift registers may be provided such that those shift registers are operated by the same clock signal as the clock signal for first registers SR1. Simultaneously, a cycle of the clock signal may be set to 1/m of one horizontal scanning cycle 1H. In addition, a time width of shift pulse SDI is set to mH. Therefore, m lines of scan lines G can be selected at the same time. In this way, it is possible to drive the display device having the multiplex pixel structure of m:1 favorably.

In this case, it is not always necessary to select m lines of scan lines G upon selecting m pieces of the pixels, but it is also possible to select less than m lines or more than m lines of the scan lines G. Therefore, the time width of the shift pulse may be also smaller than mH or larger than mH.

In addition to the foregoing example, the constitution cited in the above-described embodiment may be partially selected, omitted or modified to another constitution to the extent not deviating from the gist of the present invention.

Next, description will be made regarding a third embodiment of the present invention.

Figure 17:
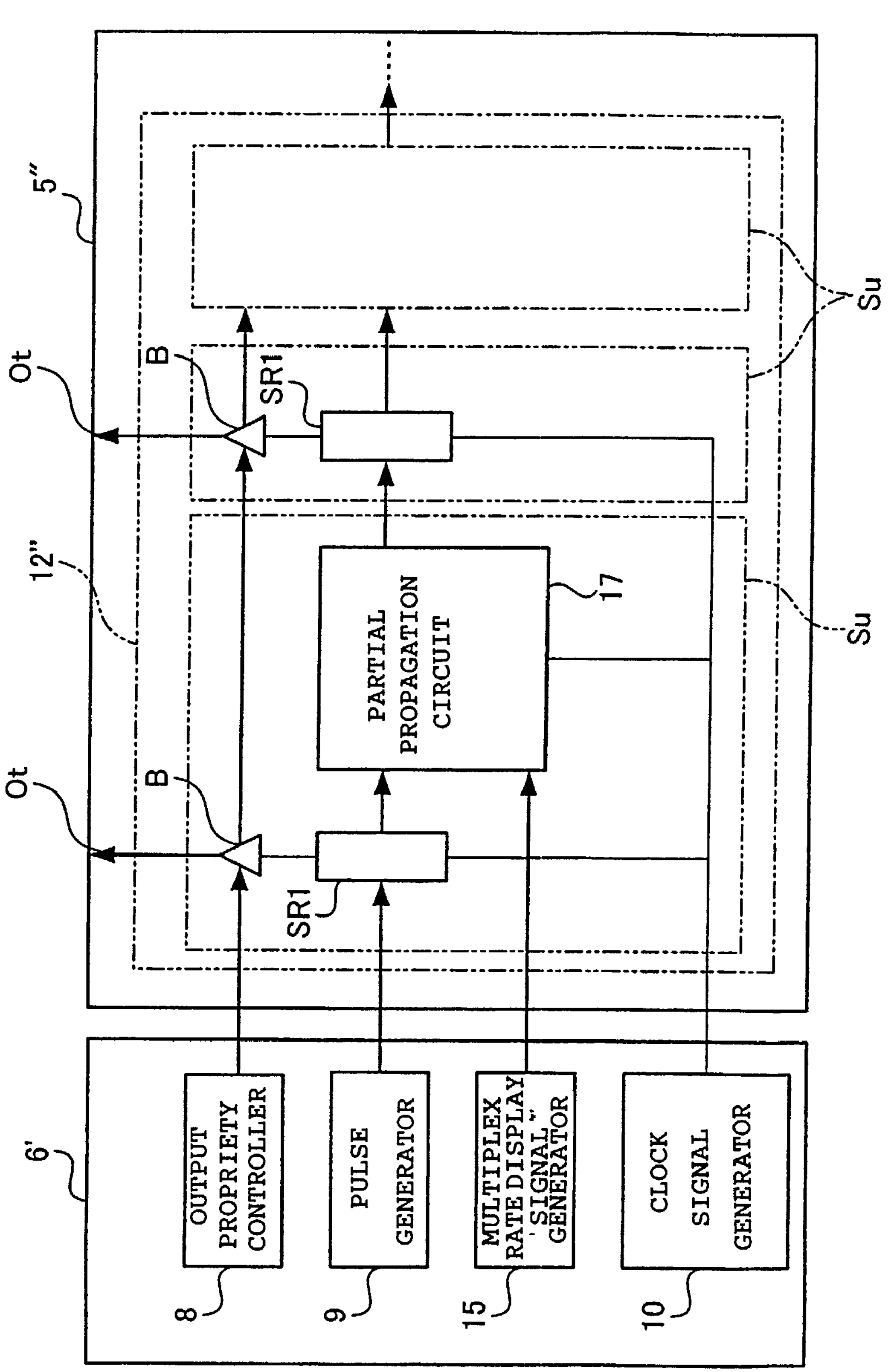
FIG. 17 is a block diagram of a control circuit and a gate driver showing relevant parts of a third embodiment of the present invention.

FIG. 17 is an enlarged block diagram of a gate driver 5" (a scan line drive circuit) and a control circuit 6' (a scan line drive circuit) according to the third embodiment of the present invention. Gate driver 5" and control circuit 6' are provided instead of the gate driver 5 and the control circuit 6 of the liquid crystal display device 1 as shown in FIG. 2.

As shown in FIG. 17, control circuit 6' is provided with an output propriety controller 8, a pulse generator (a signal sequence generator) 9 and a clock signal generator 10, as similar to the above-described first and the second embodiments. In addition, control circuit 6' is provided with a multiplex rate display signal generator 15. This multiplex rate display signal generator 15 generates a multiplex rate display signal indicating a multiplex rate of pixels (the number of pixels among pixels in one row, to which electric potential is supplied from the same signal line) in a display area S (see FIG. 2).

Meanwhile, gate driver 5" is provided with a shift register unit (a propagation circuit) 12". Shift register unit 12" includes first shift registers SR1, each of which is provided corresponding to each scan line G and connected with an output terminal Ot connectable with scan line G via a buffer (an output circuit) B. In addition, shift register unit 12" includes partial propagation circuits 17. This shift register unit 12" has a constitution of cascade connection of multiple pairs Su, Su, and so on (illustration partially omitted) corresponding to scan lines G, in which Su is a pair of first shift register SR1 and partial propagation circuit 17.

Partial propagation circuit 17 is designed to allow a shift pulse generated by pulse generator 9 to pass therethrough, or is designed to function as a single shift register or as multiple shift registers based on the multiplex rate display signal supplied from multiplex rate display signal generator 15.

In other words, if the multiplex rate display signal indicates "m (where m is an arbitrary natural number equal to or larger than 2)" as the multiplex rate of a display region S, then partial propagation circuit 17 functions as cascade connection of (m−1) shift registers operated synchronously with a clock signal. Alternatively, if the multiplex rate display signal indicates "1" as the multiplex rate of the display region S, then the propagation circuit functions as a circuit to allow the shift pulse to pass directly therethrough.

Next, description will be made regarding operations in the case that control circuit 6' and gate driver 5" having the above-described constitutions are set as circuits for outputting a scanning signal to scan lines G of liquid crystal display device 1.

In this case, clock signal generator 10 outputs a clock signal in which m cycles thereof correspond to one horizontal scanning cycle (1H) of a screen.

In the meantime, pulse generator 9 outputs a shift pulse (a signal sequence) in which a time width thereof corresponds to two horizontal scanning cycles (2H), for example. Note that this shift pulse is set to turn on and off in each cycle of the clock signal.

Here, when the shift pulse is generated by pulse generator 9, this shift pulse is serially transferred through first shift registers SR1 and partial propagation circuits 17. Here, focusing on two adjacent first shift registers SR1, for example, a first shift register SR1(n) located in an n-th position in a direction of propagation of the shift pulse and a first shift register SR1(n+1) located in an n+1-th position, for example, then shift pulse SDI at first shift register SR1(n) passes through partial propagation circuit 17 and is inputted to the next first shift register SR1(n+1) in arrears of m cycles of the clock signal, that is, in arrears of one horizontal scanning cycle. Here, since the time width of shift pulse is 2 horizontal scanning cycles, the shift pulse will partially coexist in first shift registers SR1(n) and SR1(n+1) for a given time period as long as one horizontal scanning cycle (1H). Accordingly, it is possible to output the scanning signal with respect to both of scanning lines Gn and Gn+1 respectively connected with these first shift registers SR1(n) and SR1(n+1), by opening buffer B in a period including this given time period.

In addition, it is possible to output the scanning signal simultaneously to a scan line set consisting of m line of scan lines G by setting the time width of shift pulse SDI as longer horizontal scanning periods (mH). Accordingly, it is possible to control driving of pixels in display area S of a m-fold pixel structure, by controlling selection or non-selection of these scan lines G in accordance with each moment of H/m.

As described above, in this third embodiment, buffer B is provided corresponding to each scan line G and shift register unit 12" is formed by cascade connection of alternate arrangements of first shift registers SR1 and partial propagation circuits 17. In addition, buffers B are connected solely with first shift registers SR1 of shift register unit 12". Moreover, shift pulse SDI is supplied to respective buffers B by serially propagating shift pulse SDI with respect to these first shift registers SR1 and partial propagation circuits 17. In this case, shift register unit 12" is driven by the clock signal having a H/M cycle dividing one horizontal scanning cycle 1H with a multiplex rate "m" of the pixels, whereby it is possible to propagate shift pulse SDI serially from shift register SR1 to each of the buffers B in a time interval of 1H which is shorter than time width mH of shift pulse SDI. In this way, it is possible to select m lines of scan lines G adjacent to one another simultaneously for a 1H period of time, whereby driving of m pieces of pixel electrodes to which a signal is supplied from the same signal line D can be controlled within one horizontal scanning cycle 1H by supplying the scanning signal from m lines of scan lines G.

Therefore, it is not necessary to arrange m systems of scan lines G or to provide m systems of OE lines 11 in order to control driving of m pieces of the pixel electrodes within one horizontal scanning cycle 1H, but control can be performed by supplying the same output control signal OE with the same OE line 11. In other words, it is possible to select a plurality of scan lines G simultaneously without complicating the control of the buffers B with the output control signal OE or a structure of the gate driver 5", whereby the structure of liquid crystal display device 1' having the multiplex pixel structure can be simplified and facilitation of fabrication as well as reduction of costs can be achieved.

Furthermore, since control circuit 6' and gate driver 5" are adoptable to a display device having a m:1 multiplex pixel structure of an arbitrary natural number, the present invention is significantly versatile. For example, clock signal generator 10 may generate a clock signal of an uneven frequency by varying timing of a leading edge or a trailing edge of each pulse of such a clock pulse. Moreover, in this above-described third embodiment, it is also acceptable to select less than m lines or more than m lines of scan lines G upon selection of m pieces of the pixels. Therefore, the time width of the shift pulse may be also smaller than mH or larger than mH.

As described above, according to the present invention, it is possible to drive a display device having a multiplex pixel structure only with simple on/off signals, and it is also possible to simplify a structure of a scan line drive circuit.

Although the preferred embodiments of the present invention have been described in detail, it should be understood that various changes, substitutions and alternations can be made therein without departing from spirit and scope of the inventions as defined by the appended claims.

What is claimed is:

1. An image display device comprising:

a plurality of signal lines for supplying display signals;

a plurality of scan lines for supplying scanning signals;

m (a number larger than 1) pieces of pixel electrodes connected with a given signal line, the pixel electrodes being serially selected in one horizontal scanning cycle;

output circuits for outputting the scanning signals, the output circuits being connected with respective input terminals of the plurality of scan lines;

a propagation circuit for propagating an inputted signal sequence, the propagation circuit being connected with the output circuits;

a clock signal generator for generating a clock signal of a cycle defined as 1/m of one horizontal scanning cycle, wherein driving of m pieces of the pixel electrodes is controlled by combinations of the scanning signals supplied from a given plurality of the scan line, the signal sequence is composed of (m×m) pieces of signals, and said propagation circuit includes shift registers serially connected with said output circuits, said propagation circuit also includes partial propagation circuits connected between said shift registers connected with said respective output circuits, said partial propagation circuits being provided for outputting the inputted signal sequence after a (m−1) number of clocks, and said propagation circuit propagates the scanning signal between the output circuits in one horizontal scanning cycle.

2. The image display device according to claim 1, wherein said partial propagation circuit is composed of cascade connection of a (m−1) number of pieces of said shift registers.

3. The image display device according to claim 1, wherein said clock signal generator is capable of adjusting the cycle of the clock signal to different cycles within one horizontal scanning cycle.

4. A scan line drive circuit comprising:

output terminals connected with respective scan lines of an image display device; and a propagation circuit connected with said output terminals, wherein the propagation circuit includes a plurality of first shift registers corresponding to the respective scan lines and partial propagation circuits, each of which is cascade-connected between said first shift registers adjacent each other, said partial propagation circuit propagating a signal inputted to one of said first shift registers to another one of said first shift registers after one horizontal scanning cycle from a moment of input thereof, wherein said partial propagation circuit is composed of one or more second shift registers.

5. A scan line drive circuit comprising:

output terminals connected with respective scan lines of an image display device; and a propagation circuit connected with said output terminals, wherein the propagation circuit includes a plurality of first shift registers corresponding to the respective scan lines and partial propagation circuits, each of which is cascade-connected between said first shift registers adjacent each other, said partial propagation circuit propagating a signal inputted to one of said first shift registers to another one of said first shift registers after one horizontal scanning cycle from a moment of input thereof, wherein each of said first shift registers is connected with said output terminal toward said scan line via a buffer, and said buffers are connected with one output control line.

6. An image display device comprising:

a plurality of pixel electrodes;

a plurality of scan lines for supplying scanning signals to selected ones of said pixel electrodes;

a signal sequence generator for generating a signal sequence including a given number of signals; and a propagation circuit for propagating said signal sequence between said scan lines with a time interval shorter than a time width of said signal sequence.

7. The image display device according to claim 6, wherein the image display device selects said pixel electrodes by use of n lines of said scan lines in one horizontal scanning cycle, and a quantity of said signals contained in said signal sequence is greater than n.

8. The image display device according to claim 7, wherein said propagation circuit propagates said signal sequence between said scan lines in one horizontal scanning cycle.

9. The image display device according to claim 6, further comprising:

output buffers connected with said plurality of scan lines, wherein each of said output buffers is controlled by one control signal upon supplying the scanning signal to said scan line.

10. A scan line drive circuit comprising:

a plurality of shift registers corresponding to respective scan lines of an image display device;

partial propagation circuits disposed between said shift registers located adjacent one another; and a multiplex rate signal generator for outputting a multiplex rate signal to said partial propagation circuits, said multiplex rate signal indicating a multiplex rate of pixels of the image display device, wherein each of said partial propagation circuits propagates a given signal from one of said shift registers to another one of said shift registers with a time interval to be set up based on the multiplex rate.

11. The scan line drive circuit according to claim 10, further comprising:

a clock signal generator for outputting a clock signal to said shift registers and to said partial propagation circuits, wherein each of said partial propagation circuits propagates the given signal from one of said shift registers to another one of said shift registers with a time interval of a (m−1) number of cycles of the clock signal in a case that the multiplex rate indicated by the multiplex rate signal is m (m is larger than 1).

12. A driver circuit for a display device comprising:

a plurality of output terminals connected with respective scan lines;

output circuits respectively connected to said respective output terminals;

first shift registers respectively connected to said output circuits;

second shift registers cascade-connected between said first shift registers; and an output control line for transmitting a control signal to control output of said output circuits wherein each of said first and second shift registers is connected with said output terminal toward said scan line via an output circuit, and said output circuits are connected with one output control line.

13. An image display device comprising:

a plurality of pixels arranged in a matrix;

a plurality of scan lines;

a plurality of signal lines;

m (a number larger than 1) pieces of pixels to be selected in a first horizontal scanning cycle, said pixels being connected with one of said signal lines;

m pieces of pixels to be selected in a second horizontal scanning cycle subsequent to the first horizontal scanning cycle, said pixels being connected with said signal line; and a drive circuit connected with said plurality of scan lines, wherein the drive circuit includes a plurality of output terminals connected with said plurality of scan lines, output circuits connected with the respective output terminals, first shift registers connected with the output circuits, a (m−1) number of pieces of second shift registers cascade-connected between said first shift registers, and an output control line for transmitting a control signal to control output of the output circuits.

14. An image display device comprising:

a plurality of pixels arranged in a matrix;

a plurality of scan lines;

a plurality of signal lines;

m (a number larger than 1) pieces of pixels to be selected in a first horizontal scanning cycle, said pixels being connected with a given signal line out of said plurality of signal lines;

m pieces of pixels to be selected in a second horizontal scanning cycle subsequent to the first horizontal scanning cycle, said pixels being connected with said given signal line; and a drive circuit connected with the plurality of scan lines, wherein the m pieces of pixels are selected in the first horizontal scanning cycle by use of a first scan line set comprised of n lines of scan lines, the other m pieces of pixels are selected in the second horizontal scanning cycle by use of a second scan line set comprised of n lines of scan lines respectively shifted by one line from the scan lines of the first scan line set, said drive circuit is controlled by a clock signal, a signal sequence composed of L pieces of signals, in which L is larger than n, is inputted to the drive circuit, said drive circuit, to which the signal sequence is inputted, outputs scanning signals serially in a range from first timing to m-th timing with respect to groups from a first scan line group to an m-th scan line group which are mutually different combinations of the scan lines severally selected from the first scan line set in the first horizontal scanning cycle, and said drive circuit initiates a process to output scanning signals serially in a range from first timing to m-th timing at m clocks after initiation of a process in the first horizontal scanning cycle with respect to groups from a first scan line group to an m-th scan line group which are mutually different combinations of the scan lines selected from the second scan line set in the second horizontal scanning cycle.

15. The image display device according to claim 14, wherein L is equal to (m×m), and n is equal to m.

* * * * *

UNITED STATES PATENT AND TRADEMARK OFFICE

CERTIFICATE OF CORRECTION

PATENT NO. : 6,967,639 B2
APPLICATION NO. : 10/252067
DATED : November 22, 2005
INVENTOR(S) : Kanzaki et al.

It is certified that error appears in the above-identified patent and that said Letters Patent is hereby corrected as shown below:

Column 2,
Line 38, remove “a” before “image” and insert -- an --.

Column 17,
Line 25, remove “line” and insert -- lines --.
Line 52, insert a semicolon -- ; -- after “lines”.

Column 19,
Line 2, insert a comma -- , -- after “circuits”.

Signed and Sealed this

Twentieth Day of June, 2006

JON W. DUDAS
*Director of the United States Patent and Trademark Office*